(12) United States Patent
In

(10) Patent No.: US 11,588,005 B2
(45) Date of Patent: Feb. 21, 2023

(54) DISPLAY APPARATUS INCLUDING CLOCK WIRING OVERLAPPING SHIELDING PATTERN AND GATE PATTERN FOR REDUCING BEZEL AREA

(71) Applicant: Samsung Display Co., Ltd., Yongin-Si (KR)

(72) Inventor: Hai-Jung In, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 116 days.

(21) Appl. No.: 17/158,368

(22) Filed: Jan. 26, 2021

(65) Prior Publication Data

US 2021/0288127 A1    Sep. 16, 2021

(30) Foreign Application Priority Data

Mar. 12, 2020   (KR) .......................... 10-2020-0030753

(51) Int. Cl.
*H01L 27/32*   (2006.01)
*H01L 27/12*   (2006.01)

(52) U.S. Cl.
CPC ...... *H01L 27/3276* (2013.01); *H01L 27/3262* (2013.01); *H01L 27/3272* (2013.01); *H01L 27/1214* (2013.01)

(58) Field of Classification Search
CPC ............ H01L 27/1214; H01L 27/3262; H01L 27/3272; H01L 27/3276

USPC .......................................................... 257/72
See application file for complete search history.

(56) References Cited

U.S. PATENT DOCUMENTS

| | | | |
|---|---|---|---|
| 9,330,593 B2 | 5/2016 | Jang | |
| 10,043,465 B2 | 8/2018 | Kim et al. | |
| 2017/0345366 A1 | 11/2017 | Jang | |
| 2018/0067357 A1* | 3/2018 | Katsuta | ............... H01L 27/3279 |
| 2019/0005885 A1* | 1/2019 | Kim | ...................... H01L 27/124 |
| 2021/0020111 A1* | 1/2021 | Yamada | .................... G09F 9/30 |

FOREIGN PATENT DOCUMENTS

KR    1020150033790 A    4/2015

* cited by examiner

*Primary Examiner* — Matthew E. Gordon
(74) *Attorney, Agent, or Firm* — Cantor Colburn LLP

(57) ABSTRACT

A display apparatus includes: a display panel; a driving circuit which provides a driving signal to the display panel and includes at least one driving transistor; and a clock signal wiring for providing a clock signal to the driving circuit. The driving circuit includes an active pattern, a gate pattern, a source pattern, and a shielding pattern, the gate pattern overlaps the active pattern in a plan view, a major surface plane of the source pattern is disposed in a layer different from a layer the active pattern is disposed in, the source pattern is electrically connected to the active pattern, the shielding pattern is disposed between the gate pattern and the clock signal wiring and applied with a constant voltage, and the clock signal wiring overlaps the gate pattern in the plan view and is disposed on the source pattern.

19 Claims, 22 Drawing Sheets

524:524a,524b
527:527a,527b

DISPLAY APPARATUS INCLUDING CLOCK WIRING OVERLAPPING SHIELDING PATTERN AND GATE PATTERN FOR REDUCING BEZEL AREA

This application claims priority to and benefits of Korean Patent Application No. 10-2020-0030753, filed on Mar. 12, 2020 and all the benefits accruing therefrom under 35 U.S.C. § 119, the content of which in its entirety is herein incorporated by reference.

BACKGROUND

1. Technical Field

Embodiments are directed to a display apparatus. More particularly, embodiments are directed to a display apparatus including shielding pattern.

2. Description of the Related Art

Until now, conventional cathode ray tube ("CRT") have been widely used in display apparatus with many advantages in terms of performance and price. However, a display apparatus having advantages such as miniaturization or portability overcoming the shortcomings of CRT and having advantages such as miniaturization, weight reduction, and low power consumption has attracted attention. For example, plasma display, liquid crystal display, organic light emitting display, and the like are attracting attention.

Attempts have been made to reduce the bezel area of the display apparatus. For example, a bezel-less display apparatus, a display apparatus including a notch, and the like have been developed. Wirings existing in the bezel area may be rearranged to reduce the bezel area.

SUMMARY

Embodiments provide a display apparatus including a shielding pattern.

According to example embodiment, a display apparatus includes: a display panel; a driving circuit which provides a driving signal to the display panel and includes at least one driving transistor; and a clock signal wiring which provides a clock signal to the driving circuit. The driving circuit includes an active pattern, a gate pattern, a source pattern, and a shielding pattern, the gate pattern overlaps the active pattern in a plan view, a major surface plane of the source pattern is disposed in a layer different from a layer the active pattern is disposed in, the source pattern is electrically connected to the active pattern, the shielding pattern is disposed between the gate pattern and the clock signal wiring and applied with a constant voltage, and the clock signal wiring overlaps the gate pattern in the plan view and is disposed on the source pattern.

In an embodiment, the shielding pattern may be disposed under the major surface plane of the source pattern.

In an embodiment, the shielding pattern may entirely overlap an entire region in which the gate pattern overlaps the clock signal wiring in the plan view.

In an embodiment, the display apparatus may further include a connection wiring disposed in the same layer as the clock signal wiring and which transmits the constant voltage to the shielding pattern.

In an embodiment, the display apparatus may further include a connection wiring disposed between the shielding pattern and the clock signal wiring, and which transmits the constant voltage to the shielding pattern.

In an embodiment, the connection wiring may not overlap each of the clock signal wiring and the gate pattern in the plan view.

In an embodiment, the gate pattern may include a first sub gate pattern and a second sub gate pattern.

In an embodiment, the first sub gate pattern and the second sub gate pattern may be disposed under the major surface plane of the source pattern.

In an embodiment, the first sub gate pattern and the second sub gate pattern may overlap the shielding pattern in the plan view.

In an embodiment, only one of the first sub gate pattern and the second sub gate pattern may overlap the shielding pattern in the plan view.

In an embodiment, the first sub gate pattern and the second sub gate pattern may be disposed in the same layer.

In an embodiment, the driving circuit may further include a drain pattern disposed between the first sub gate pattern and the second sub gate pattern and electrically connected to the active pattern.

In an embodiment, only one of the first sub gate pattern and the second sub gate pattern may overlap the shielding pattern in the plan view.

In an embodiment, the shielding pattern may include a first sub shielding pattern and a second sub shielding pattern.

In an embodiment, the first sub gate pattern and the second sub gate pattern may overlap the first sub shielding pattern and the second sub shielding pattern, respectively, in the plan view.

In an embodiment, the shielding pattern may be disposed on the source pattern.

In an embodiment, the driving circuit may include a p-type transistor.

In an embodiment, the driving circuit may include an n-type transistor.

In an embodiment, the driving circuit includes a dual-gate transistor.

The display apparatus according to an embodiment may include a display panel, a driving circuit providing a driving signal to the display panel and including at least one driving transistor and a clock signal wiring for providing a clock signal to the driving circuit, the driving circuit includes an active pattern, a gate pattern overlapping the active pattern, a source pattern disposed on a layer different from the active pattern and electrically connected to the active pattern, and a shielding pattern disposed between the gate pattern and the clock signal wiring applied with a constant voltage, and the clock signal wiring overlaps the gate pattern and is disposed on the source pattern. Accordingly, a bezel area of the display apparatus may be reduced. In addition, a coupling phenomenon that may occur between the gate pattern and the clock signal wiring can be effectively prevented.

It is to be understood that both the foregoing general description and the following detailed description are exemplary and explanatory and are intended to provide further explanation of the invention as claimed.

BRIEF DESCRIPTION OF THE DRAWINGS

Aspects of embodiments of the invention will be more clearly understood from the following detailed description taken in conjunction with the accompanying drawings.

DETAILED DESCRIPTION

Figure 1:
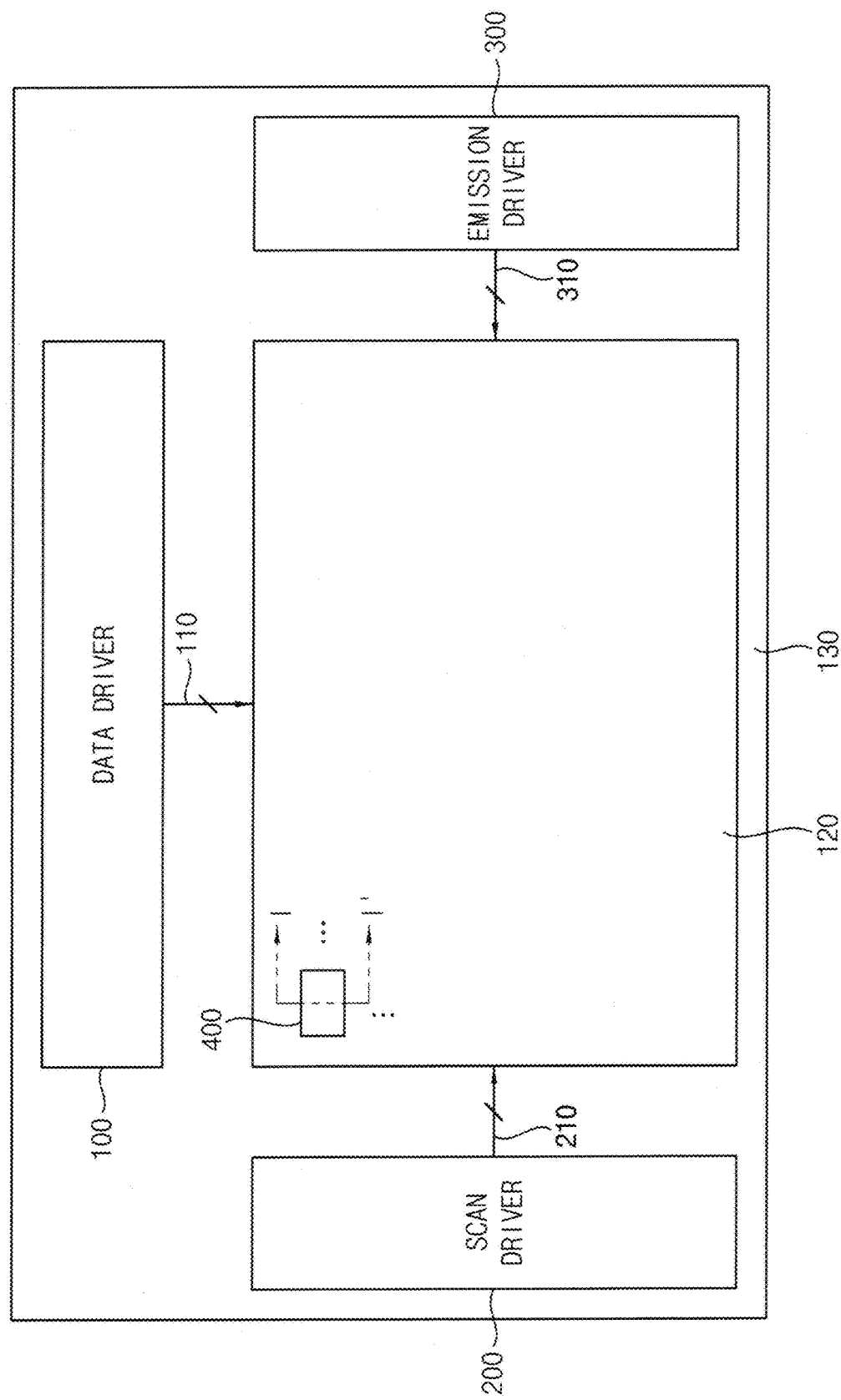
FIG. 1 is a plan view illustrating a display apparatus according to an embodiment of the present invention.

A display apparatus according to embodiments of the invention will be described hereinafter with reference to the accompanying drawings, in which embodiments are shown. Same or similar reference numerals may be used for same or similar elements in the drawings.

The invention may have various modifications and may be embodied in different forms, and embodiments will be explained in detail with reference to the accompany drawings. The invention may, however, be embodied in different forms and should not be construed as limited to the embodiments set forth herein. Rather, all modifications, equivalents, and substituents which are included in the spirit and technical scope of the invention should be included.

In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element. As used herein, the singular forms are intended to include the plural forms as well, unless the context clearly indicates otherwise.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or".

The phrase "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be further understood that the terms "comprises," "comprising," "includes," and/or "including," when used in this specification, specify the presence of stated features, numerals, steps, operations, elements, parts, or the combination thereof, but do not preclude the presence or addition of one or more other features, numerals, steps, operations, elements, parts, or the combination thereof.

It will also be understood that when a layer, a film, a region, a plate, etc. is referred to as being "on" or "above" another part, it can be "directly on" the other part, or intervening layers may also be present. It will also be understood that when a layer, a film, a region, a plate, etc. is referred to as being "under" or "below" another part, it can be "directly under" the other part, or intervening layers may also be present. When an element is referred to as being disposed "on" another element, it can be disposed under the other element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
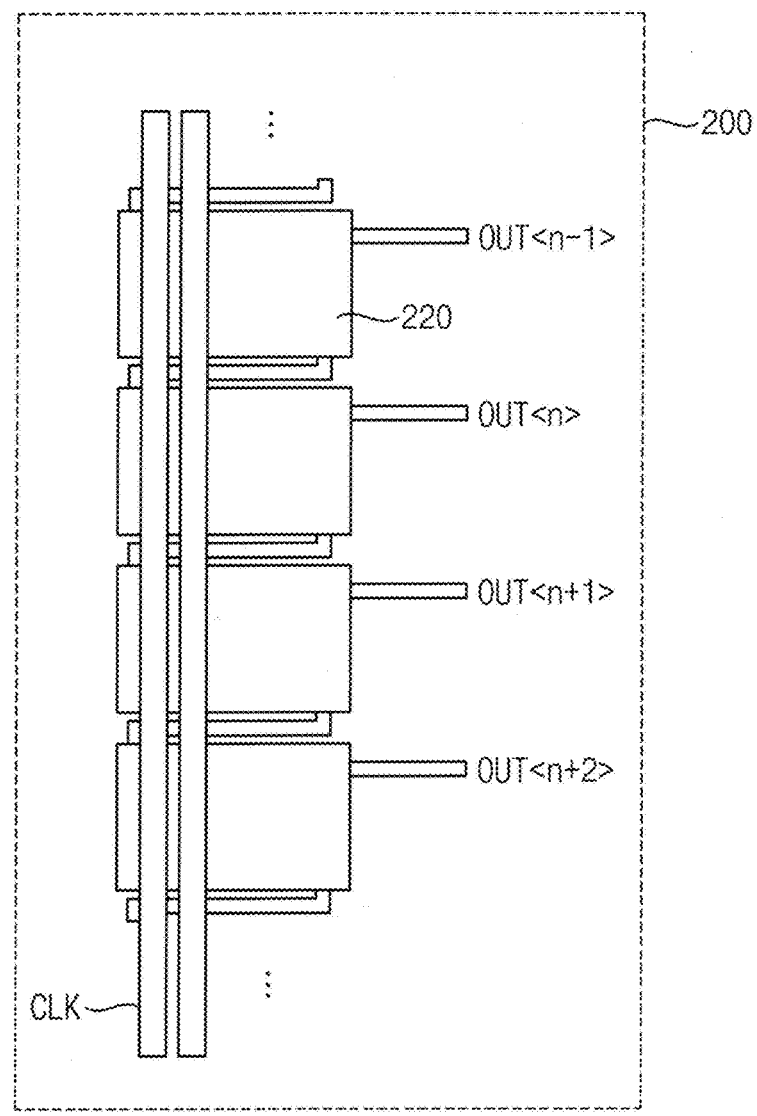
FIG. 2 is a diagram illustrating an embodiment of the structure of a scan driver.
Figure 3:
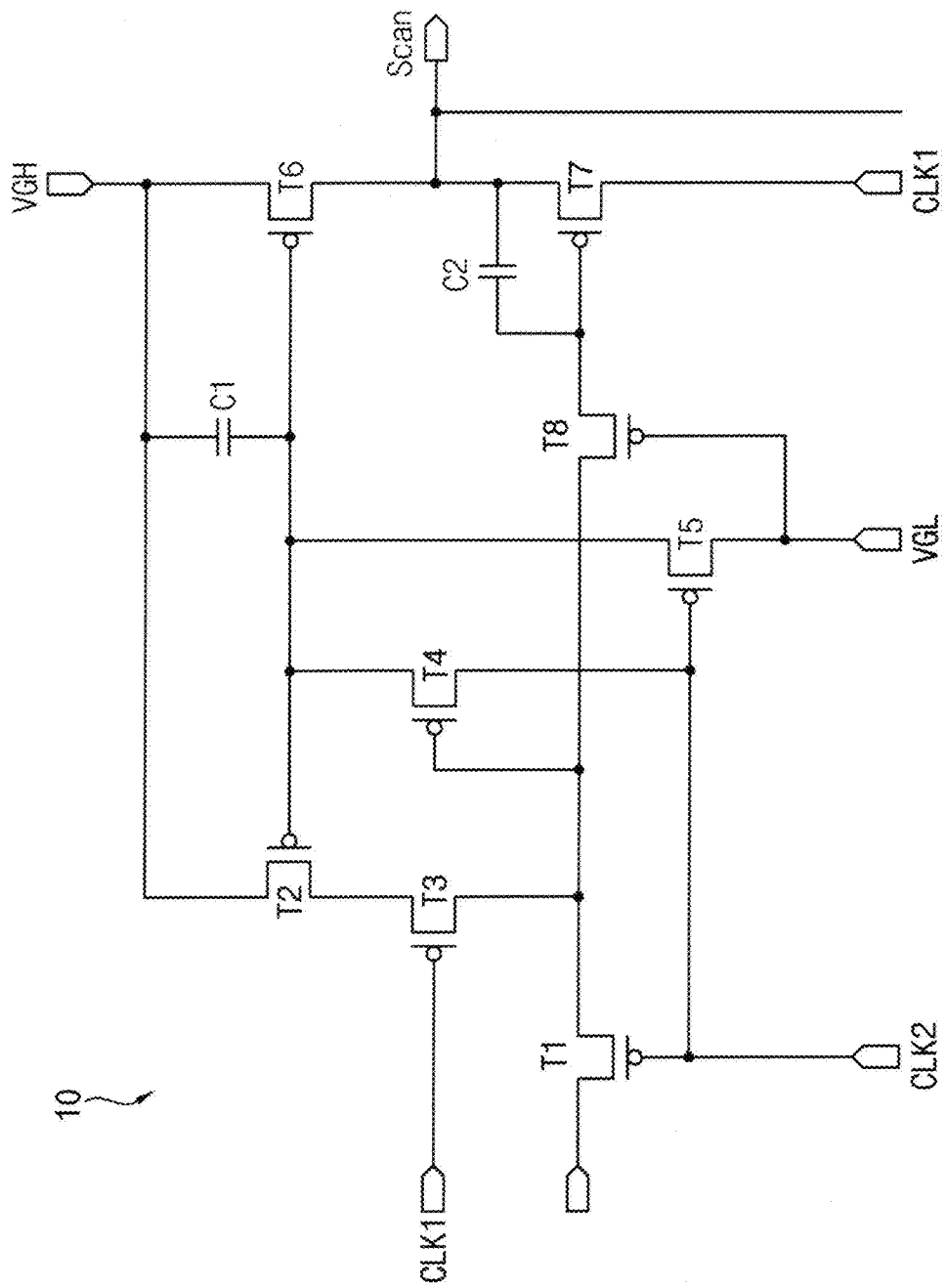
FIG. 3 is a diagram illustrating an embodiment of a scan driving circuit built into a scan shift register.
Figure 4:
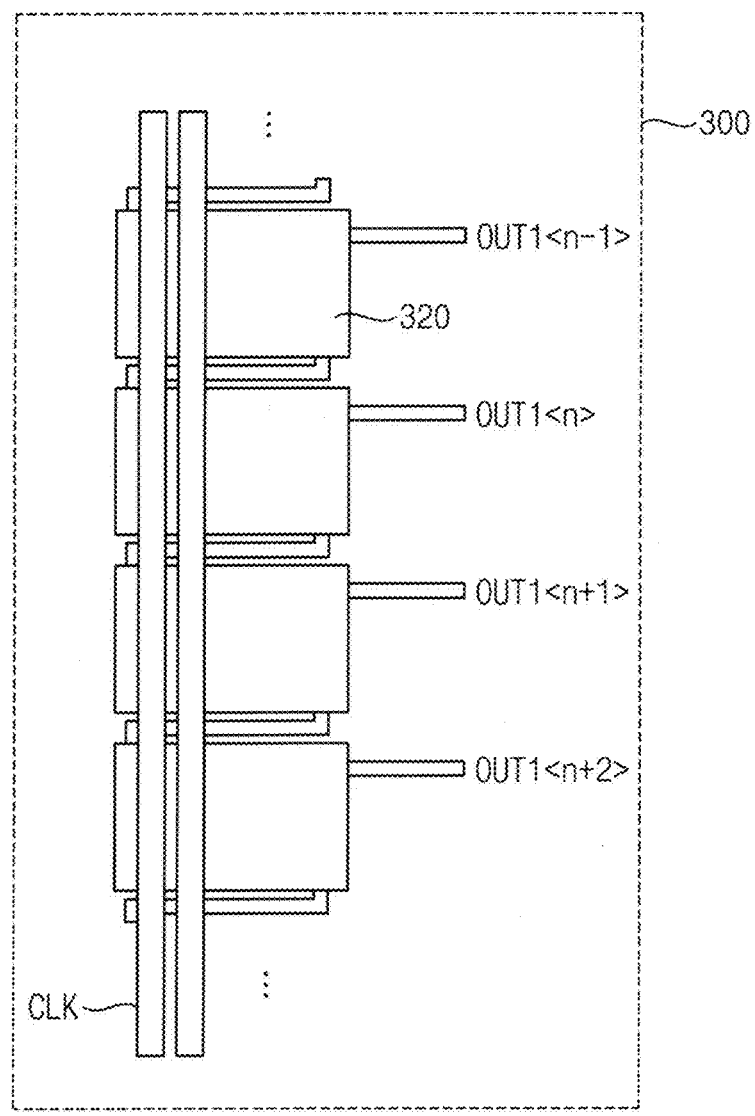
FIG. 4 is a diagram illustrating an embodiment of the structure of an emission driver.
Figure 5:
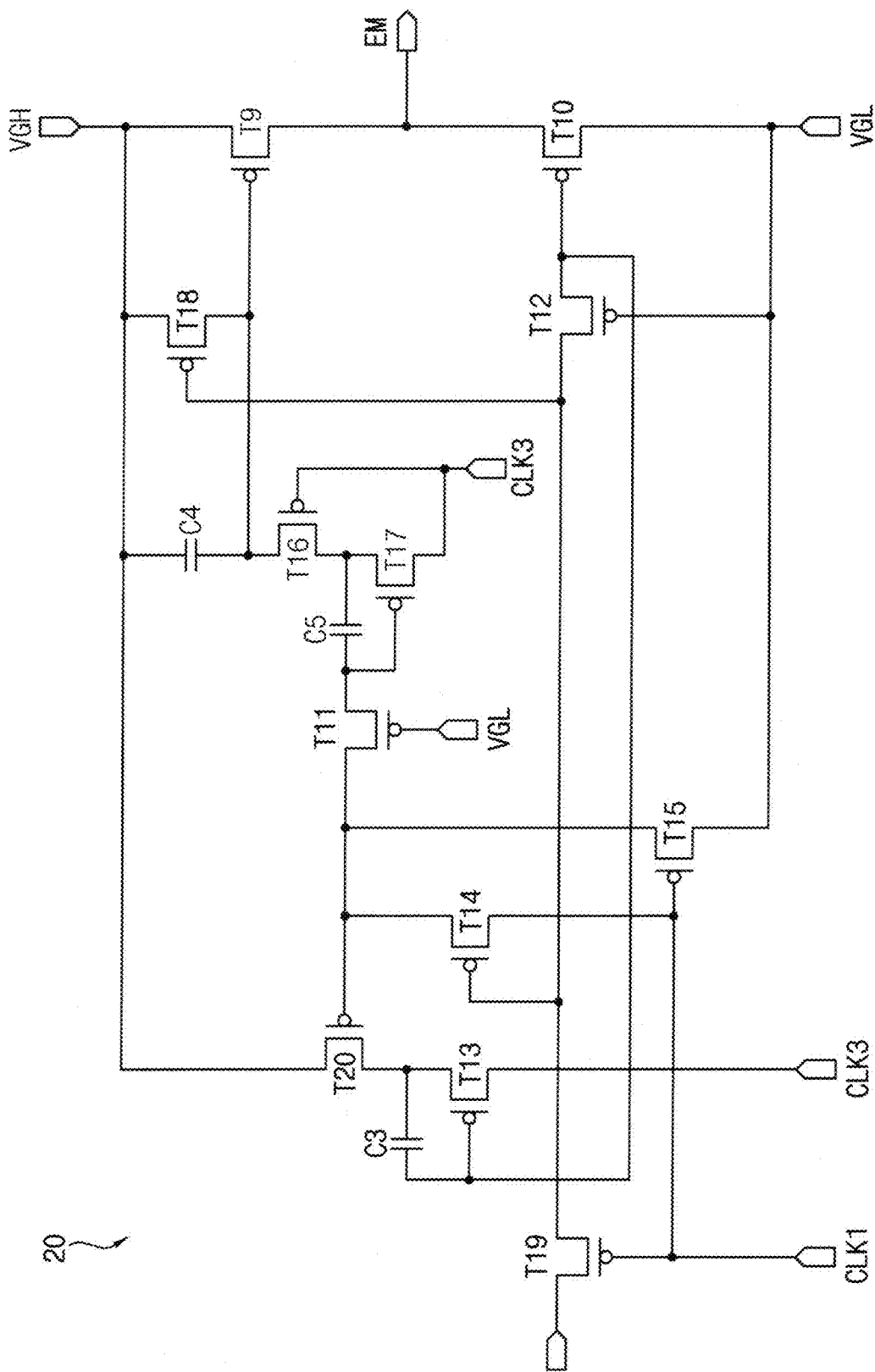
FIG. 5 is a diagram illustrating an embodiment of an emission driving circuit built into an emission shift register.
Figure 6:
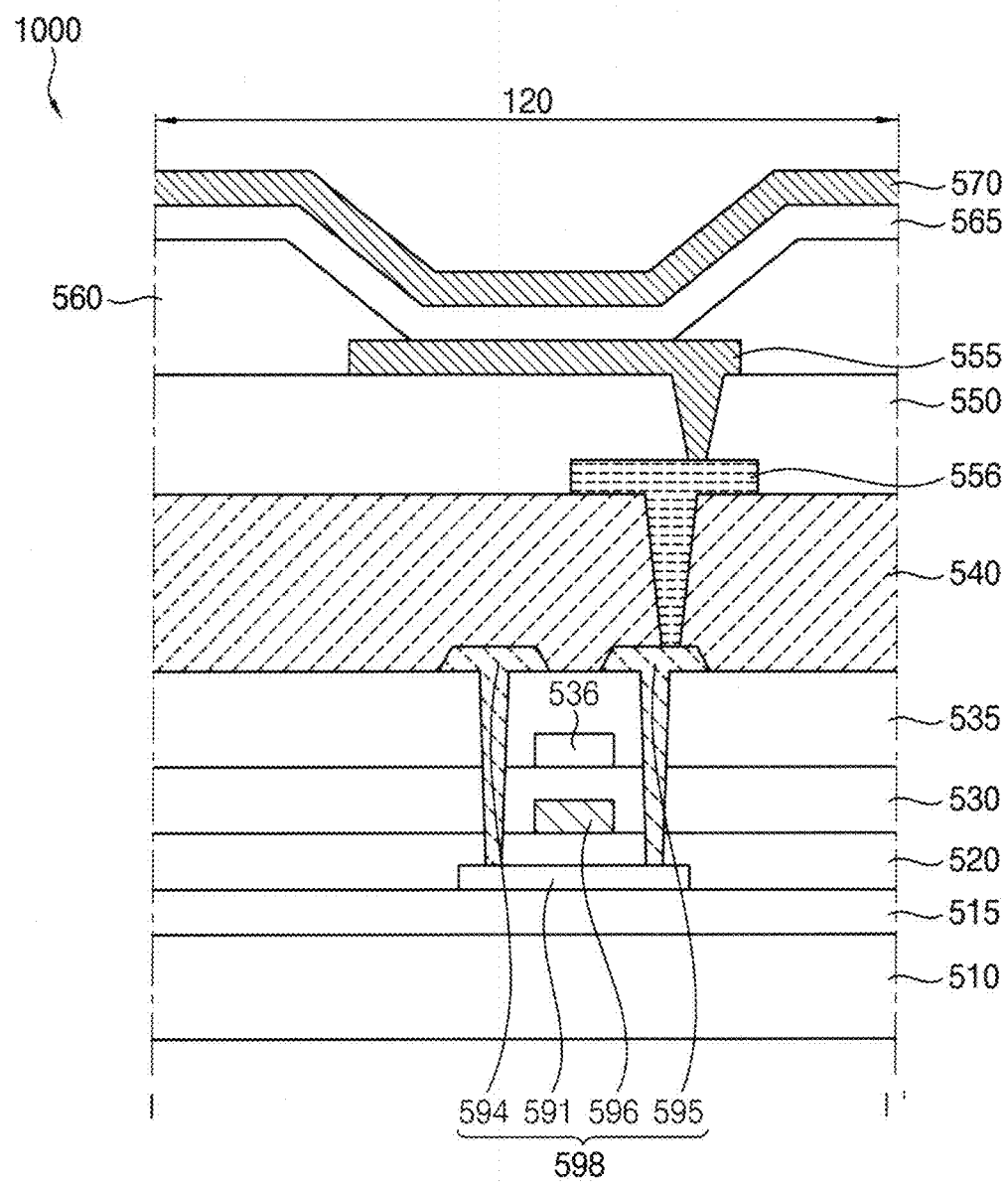
FIG. 6 is a cross-sectional view taken along line I-I' of FIG. 1.

FIG. 1 is a plan view illustrating a display apparatus according to an embodiment of the present invention, FIG. 2 is a diagram illustrating an embodiment of the structure of a scan driver (FIG. 2 is a plan view), FIG. 3 is a diagram illustrating an embodiment of a scan driving circuit built into a scan shift register, FIG. 4 is a diagram illustrating an embodiment of the structure of an emission driver (FIG. 4 is a plan view), FIG. 5 is a diagram illustrating an embodiment of an emission driving circuit built into an emission shift register, and FIG. 6 is a cross-sectional view taken along line I-I' of FIG. 1.

Referring to FIGS. 1 to 6, A display apparatus 1000 may include a display panel 120 including a plurality of pixels 400 and a driving circuit 130 for driving the display panel 120. The driving circuit 130 may include a data driver 100 providing data signals 110 to the plurality of pixels 400, a scan driver 200 providing scan signals 210 to the plurality of pixels 400, and an emission driver 300 providing emission signals 310 to the plurality of pixels 400.

The display panel 120 may include the plurality of pixels 400 connected to a plurality of data wirings and a plurality of scan wirings. The pixels 400 may be arranged in a matrix form over the entire area of the display panel 120. However, this is exemplary, and the arrangement in which the pixels 400 are arranged according to the invention is not limited thereto. Each pixel 400 may include at least two transistors, at least one capacitor, and an organic light emitting diode 580. The display panel 120 may be an organic light emitting display panel. The pixel 400 may be a Hybrid Oxide Polycrystalline ("HOP") pixel suitable for low-frequency driving to reduce power consumption. The HOP pixel may include at least one Low-temperature polycrystalline silicon ("LTPS") PMOS transistor and at least one oxide NMOS transistor. However, this is exemplary and the invention is not limited thereto.

In FIG. 1, the scan driver 200 and the emission driver 300 are illustrated to be positioned on both sides of the display panel 120, respectively, but this is exemplary and the invention is not limited thereto. In another embodiment, for example, the positions of the scan driver 200 and the emission driver 300 may be changed. Also, both the scan driver 200 and the emission driver 300 may be located on the same side of the display panel 120.

As illustrated in FIG. 2, the scan driver 200 may include a plurality of scan shift registers 220 and a plurality of clock signal wirings CLK connected to the plurality of scan shift registers 220. In an embodiment, the plurality of clock signal wirings CLK may be disposed to overlap the scan shift registers 220 in a plan view. When the plurality of clock signal wirings CLK are disposed to overlap the plurality of scan shift registers 220 in a plan view, a bezel area of the display apparatus 1000 may decrease.

The scan shift register 220 may include a scan driving circuit 10. In an embodiment, the scan driving circuit 10 may include first to eighth scan driving transistors T1 to T8, and first and second capacitors C1 and C2. A coupling phenomenon may occur in some transistors T2, T4, T6, and T7 to which a plurality of clock signals CLK1 and CLK2 is not directly applied as a turned-on signal and a constant voltage (i.e., a first constant voltage VGH, a second constant voltage VGL) is not directly applied as a turned-on signal. When a coupling phenomenon occurs, a glitch may occur in a scan output. As a result, performance of the display apparatus 1000 may deteriorate. In the scan driving circuit 10 in FIG. 3, the clock signal CLK1 is applied to the transistor T3 as a gate-on signal, the clock signal CLK2 is applied to the transistors T1 and T5 as a gate-on signal, the second constant voltage VGL may be applied to the transistors T8 as a gate-on signal, and an output signal Scan corresponds to an output signal OUT<n> of n-th scan shift register 220. Here, n is a natural number. Output signals OUT<n−1> to OUT<n+2> correspond to output signals of n−1-th to n+2-th scan shift registers 220, respectively.

The scan driving circuit 10 of FIG. 3 is illustrated as including a p-type transistor, but the invention is not limited thereto. In another embodiment, the scan driving circuit 10 may include an n-type transistor.

As illustrated in FIG. 4, the emission driver 300 may include a plurality of emission shift registers 320 and a plurality of clock signal wirings CLK connected to the plurality of emission shift registers 320. In an embodiment, the plurality of clock signal wirings CLK may be disposed to overlap the plurality of emission shift registers 320 in a plan view. When the plurality of clock signal wirings CLK are disposed to overlap the plurality of emission shift registers 320 in a plan view, the bezel area of the display apparatus 1000 may be reduced.

The emission shift register 320 may include an emission driving circuit 20. In an embodiment, the emission driving circuit 20 may include ninth to twentieth emission driving transistors T9 to T20, and third to fifth capacitors C3, C4, C5. A coupling phenomenon may occur in some transistors T9, T10, T13, T14, T17, T18, T20 to which a plurality of clock signals CLK1 and CLK3 is not directly applied as a gate-on signal and a constant voltage (i.e., a first constant voltage VGH, a second constant voltage VGL) is not directly applied as a gate-on signal. In the emission driving circuit 20 in FIG. 5, the clock signal CLK1 may be applied to the transistors T15 and T19 as a gate-on signal, the clock signal CLK3 may be applied to the transistor T16 as a gate-on signal, the second constant voltage VGL may be applied to the transistors T11 and T12 as a gate-on signal and an output signal EM corresponds to an output signal OUT1<n> of n-th emission shift register 320. Output signals OUT1<n−1> to OUT1<n+2> correspond to output signals of n−1-th to n+2-th emission shift registers 320, respectively.

The emission driving circuit 20 of FIG. 5 is illustrated to include a p-type transistor, but is the invention not limited thereto. In another embodiment, the emission driving circuit 20 may include an n-type transistor.

As illustrated in FIG. 6, the display panel 120 may include a substrate 510, a buffer layer 515, a gate insulating layer 520, a display panel transistor 598, a first interlayer-insulating layer 530, a second interlayer-insulating layer 535, a capacitance electrode 536, a first via-insulating layer 540, a connection electrode 556, a second via-insulating layer 550, a pixel defining layer 560, and an organic light emitting diode 580. The display panel transistor 598 may include an active pattern 591, a source pattern 594, a drain pattern 595, and a gate pattern 596. The organic light emitting diode 580 may include a lower electrode 555, an intermediate layer 565, and an upper electrode 570.

The substrate 510 may include or be formed of various materials such as quartz, synthetic quartz, calcium fluoride, fluorine-doped quartz, soda lime glass, non-alkali glass, polyethylene terephthalate ("PET"), polyethylen naphthalate ("PEN"), polyimide and the like.

The buffer layer 515 may be disposed on the substrate 510. The buffer layer 515 may prevent diffusion of metal atoms or impurities from the substrate 510 to the pixel 400. The buffer layer 515 may obtain a substantially uniform active pattern 591 by controlling a heat transfer rate during the crystallization process for forming the active pattern 591. Also, when a top surface of the substrate 510 is not uniform, the buffer layer 515 may serve to improve the flatness of the top surface of the substrate 510. Two or more buffer layers 515 may be provided on the substrate 510 according to the type of the substrate 510. Alternatively, the buffer layer 515 may not be disposed on the substrate 510 That is, buffer layer 515 may be omitted. In an embodiment, the buffer layer 515 may include an organic material or an inorganic material. For example, the buffer layer 515 may have a single layer or multilayer structure including or formed of an inorganic insulating material such as silicon oxide, silicon nitride or silicon oxynitride.

The active pattern 591 may be disposed on the buffer layer 515. The active pattern 591 may include a metal oxide semiconductor, an inorganic semiconductor, or an organic semiconductor and the like. The active pattern 591 may include a channel region, a source region, and a drain region.

The gate insulating layer 520 may be disposed on the buffer layer 515. The gate insulating layer 520 may cover the active pattern 591 on the buffer layer 515 and have a flat top surface without forming a level difference around the active pattern 591. Optionally, the gate insulating layer 520 may be disposed on the buffer layer 515 to have substantially the same thickness along the profile of the active pattern 591. The gate insulating layer 520 may include a silicon compound, a metal oxide, or the like. For example, the gate insulating layer 520 may include silicon oxide (SiO), silicon nitride (SiN), silicon oxynitride (SiON), silicon oxycarbide (SiOC), silicon carbonitride (SiCN), aluminum oxide (AlO), Aluminum nitride (AlN), tantalum oxide (TaO), hafnium oxide (HfO), zirconium oxide (ZrO), titanium oxide (TiO), or the like. In an embodiment, the gate insulating layer 520 may have a multilayer structure including a plurality of insulating layers. The insulating layers may have different materials and different thicknesses. These may be used alone or in combination with each other.

The gate pattern 596 may be disposed on the gate insulating layer 520. The gate pattern 596 may be disposed on a portion of the gate insulating layer 520 where the active pattern 591 is positioned below. The gate pattern 596 may include a metal, an alloy, a metal nitride, a conductive metal oxide, a transparent conductive material, or the like. For example, the gate pattern 596 may be formed of one or more materials of aluminum (Al), platinum (Pt), palladium (Pd), silver (Ag), magnesium (Mg), gold (Au), nickel (Ni), neodymium (Nd), iridium (Ir), chromium (Cr), Nickel (Ni), calcium (Ca), molybdenum (Mo), titanium (Ti), tungsten (W), and copper (Cu), and may be formed as a single layer or a multi-layer.

The first interlayer-insulating layer 530 may be disposed on the gate insulating layer 520. The first interlayer-insulating layer 530 may cover the gate pattern 596 on the gate insulating layer 520 and may have a flat top surface without forming a level difference around the gate insulating layer 520. Optionally, the first interlayer-insulating layer 530 may be disposed on the gate insulating layer 520 to have substantially the same thickness along the profile of the gate pattern 596. The first interlayer-insulating layer 530 may include a silicon compound, a metal oxide, or the like. For example, the first interlayer-insulating layer 530 may include silicon oxide (SiO), silicon nitride (SiN), silicon oxynitride (SiON), silicon oxycarbide (SiOC), silicon carbonitride (SiCN), aluminum oxide (AlO), Aluminum nitride (AlN), tantalum oxide (TaO), hafnium oxide (HfO), zirconium oxide (ZrO), titanium oxide (TiO), or the like. In an embodiment, the first interlayer-insulating layer 530 may have a multilayer structure including a plurality of insulating layers. The insulating layers may have different materials and different thicknesses. These may be used alone or in combination with each other.

The capacitance electrode 536 may be disposed on the first interlayer-insulating layer 530. The capacitance electrode 536 may be disposed on a portion of the first interlayer-insulating layer 530 where the gate pattern 596 is positioned below. The capacitance electrode 536 may include a metal, an alloy, a metal nitride, a conductive metal oxide, a transparent conductive material, or the like. For example, the capacitance electrode 536 may include or be formed of one or more materials of aluminum (Al), platinum (Pt), palladium (Pd), silver (Ag), magnesium (Mg), gold (Au), nickel (Ni), neodymium (Nd), iridium (Ir), chromium (Cr), Nickel (Ni), calcium (Ca), molybdenum (Mo), titanium (Ti), tungsten (W), and copper (Cu), and may be formed as a single layer or a multi-layer.

The second interlayer-insulating layer 535 may cover the capacitance electrode 536 on the first interlayer-insulating layer 530 and may have a flat top surface without forming a level difference around the capacitance electrode 536. Optionally, the second interlayer-insulating layer 535 may be disposed on the first interlayer-insulating layer 530 to have substantially the same thickness along the profile of the capacitance electrode 536. The second interlayer-insulating layer 535 may include a silicon compound, a metal oxide, or the like. For example, the second interlayer-insulating layer 535 may include silicon oxide (SiO), silicon nitride (SiN), silicon oxynitride (SiON), silicon oxycarbide (SiOC) silicon carbonitride (SiCN), aluminum oxide (AlO), Aluminum nitride (AlN), tantalum oxide (TaO), hafnium oxide (HfO), zirconium oxide (ZrO), titanium oxide (TiO), and the like. In an embodiment, the second interlayer-insulating layer 535 may have a multilayer structure including a plurality of insulating layers. The insulating layers may have different materials and different thicknesses. These may be used alone or in combination with each other.

The source pattern 594 and the drain pattern 595 may be disposed on the second interlayer-insulating layer 535. The source pattern 594 may be connected to the source region of the active pattern 591 through a contact hole penetrating the first interlayer-insulating layer 530, the second interlayer-insulating layer 535, and the gate insulating layer 520. In an embodiment, the source pattern 594 and the source regions of the active pattern 591 may constitute a source electrode. The drain pattern 595 may be connected to the drain region of the active pattern 591 through a contact hole penetrating the first interlayer-insulating layer 530, the second interlayer-insulating layer 535, and the gate insulating layer 520. In an embodiment, the drain pattern 595 and the drain region of the active pattern 591 may constitute a drain electrode. The source pattern 594 and the drain pattern 595 may include a metal, an alloy, a metal nitride, a conductive metal oxide, a transparent conductive material, or the like. For example, the source pattern 594 and the drain pattern 595 may include or be formed of one or more materials of aluminum (Al), platinum (Pt), palladium (Pd), silver (Ag), magnesium (Mg), gold (Au), nickel (Ni), neodymium (Nd), iridium (Ir), chromium (Cr), Nickel (Ni), calcium (Ca), molybdenum (Mo), titanium (Ti), tungsten (W), and copper (Cu), and may be formed as a single layer or a multi-layer.

The first via-insulating layer 540 may be disposed on the second interlayer-insulating layer 535 and may cover the source pattern 594 and the drain pattern 595. The first via-insulating layer 540 may be disposed to have a relatively thick thickness to sufficiently cover the source pattern 594 and the drain pattern 595, and in this case, the first via-insulating layer 540 may have a substantially flat top surface. In order to implement such the flat top surface of the first via-insulating layer 540, a planarization process may be added to the first via-insulating layer 540. Optionally, the first via-insulating layer 540 may cover the source pattern 594 and the drain pattern 595 and may be disposed along the profiles of the source pattern 594 and the drain pattern 595 with a uniform thickness. The first via-insulating layer 540 may be made of an organic material or an inorganic material. In an embodiment, the first via-insulating layer 540 may be formed of an organic material such as acrylic, benzocyclobutene ("BCB"), polyimide, or hexamethyldisiloxane ("HMDSO").

The connection electrode 556 may be disposed on the first via-insulating layer 540. The connection electrode 556 may be connected to the source pattern 594 or the drain pattern 595 through a contact hole penetrating the first via-insulating layer 540. The connection electrode 556 may include a metal, an alloy, a metal nitride, a conductive metal oxide, a transparent conductive material, or the like. For example, the connection electrode 556 may be formed of one or more materials of aluminum (Al), platinum (Pt), palladium (Pd), silver (Ag), magnesium (Mg), gold (Au), nickel (Ni), neodymium (Nd), iridium (Ir), chromium (Cr), Nickel (Ni), calcium (Ca), molybdenum (Mo), titanium (Ti), tungsten (W), and copper (Cu), and may be formed as a single layer or a multi-layer.

The second via-insulating layer 550 may be disposed on the first via-insulating layer 540 and may cover the connection electrode 556. The second via-insulating layer 550 may be disposed to have a relatively thick thickness to sufficiently cover the connection electrode 556, and in this case, the second via-insulating layer 550 may have a substantially flat top surface. In order to implement such the flat top surface of the second via-insulating layer 550, a planarization process may be added to the second via-insulating layer 550. Optionally, the second via-insulating layer 550 may cover the connection electrode 556 and may be disposed along the profiles of the connection electrode 556 with a uniform thickness. The second via-insulating layer 550 may be made of an organic material or an inorganic material. In an embodiment, the second via-insulating layer 550 may include a material that is substantially the same as or similar to the first via-insulating layer 540.

The lower electrode 555 may be disposed on the second via-insulating layer 550. The lower electrode 555 may include a transparent electrode, a reflective electrode, or a transflective electrode. The lower electrode 555 may be connected to the connection electrode 556 through a contact hole penetrating the second via-insulating layer 550. In an embodiment, the lower electrode 555 may be one of an anode electrode or a cathode electrode.

A pixel defining layer 560 exposing a portion of the upper surface of the lower electrode 555 may be disposed on the second via-insulating layer 550. The pixel defining layer 560 may include an organic material.

The intermediate layer 565 may be disposed on the lower electrode 555 in which a portion of the upper surface is exposed by the pixel defining layer 560. The intermediate layer 565 may have a structure in which a hole injection layer, a hole transport layer, a light emitting layer, an electron transport layer, an electron injection layer, or the like are stacked in a single or complex structure.

The upper electrode 570 may be disposed on the intermediate layer 565. The upper electrode 570 may include a translucent electrode or a reflective electrode. In one embodiment, the upper electrode 570 may be one of the cathode electrode or the anode electrode.

Figure 7:
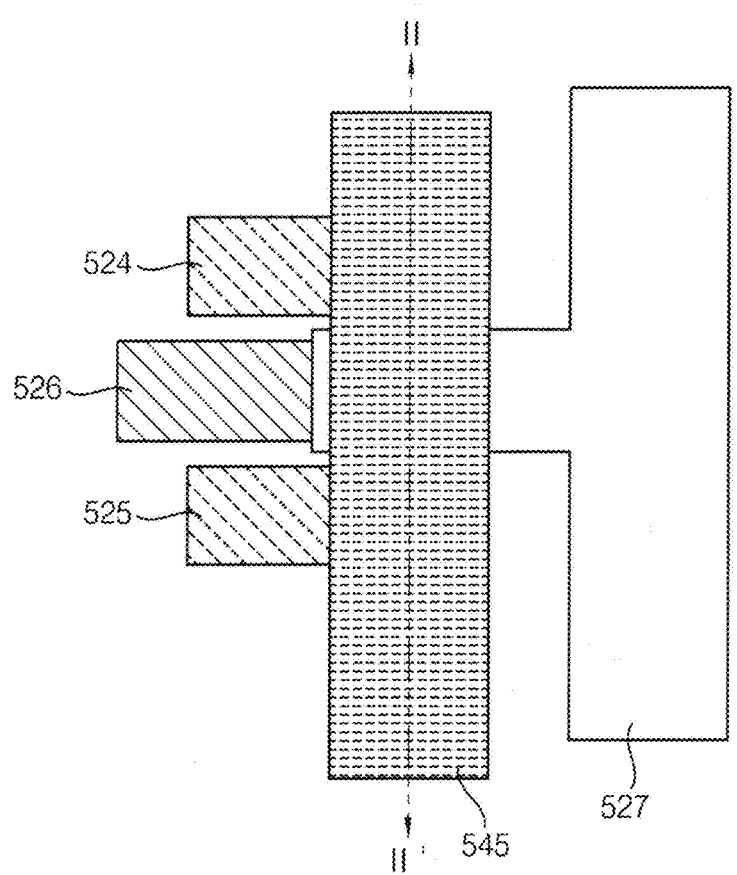
FIG. 7 is a plan view illustrating an embodiment of a driving transistor.
Figure 8:
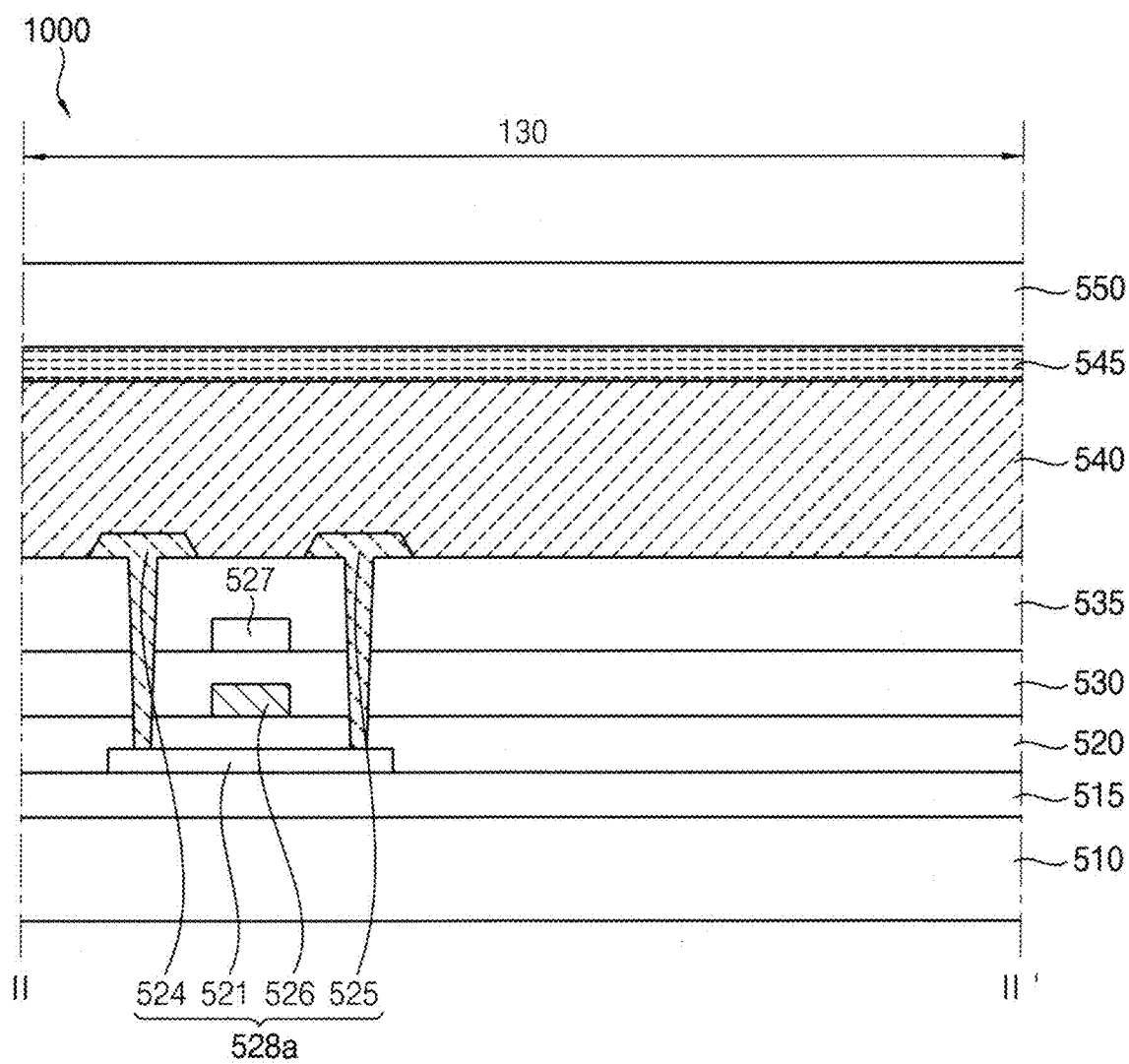
FIG. 8 is a cross-sectional view taken along line II-II' of FIG. 7.

FIG. 7 is a plan view illustrating an embodiment of a driving transistor, and FIG. 8 is a cross-sectional view taken along line II-II' of FIG. 7.

Referring to FIGS. 7 and 8, the transistor of FIG. 7 may be a transistor disposed in the scan driver 200 or the emission driver 300 of FIG. 1. The transistor of FIG. 7 may correspond to a transistor to which a clock signal is not directly applied as a turned-on signal and a constant voltage (e.g., a first constant voltage VGH, a second constant voltage VGL) is not directly applied as a turned-on signal among the transistors in the scan driving circuit 10 of FIG. 3 and the emission driving circuit 20 of FIG. 5. In an embodiment, the transistor of FIG. 7 may correspond to one of the second, fourth, sixth, and seventh transistors T2, T4, T6, and T7 of FIG. 3. In an embodiment, the transistor of FIG. 7 may correspond to one of the ninth, tenth, thirteenth, fourteenth, seventeenth, eighteenth, and twentieth transistors T9, T10, T13, T14, T17, T18, and T20 of FIG. 5. This may be the same for the transistors of FIGS. 9, 11, 13, 15, 17, 19, and 21.

The driving circuit 130 may include a substrate 510, a buffer layer 515, a gate insulating layer 520, a driving transistor 528a, a first interlayer-insulating layer 530, a second interlayer-insulating layer 535, a first via-insulating A layer 540, a second via-insulating layer 550, a shielding pattern 527, and a clock signal wiring 545. The driving transistor 528a may include an active pattern 521, a source pattern 524, a drain pattern 525, and a gate pattern 526. In an embodiment, the source pattern 524 and a source region of the active pattern 521 may constitute a source electrode, and the drain pattern 525 and a drain region of the active pattern 521 may constitute a drain electrode.

The second interlayer-insulating layer 535 may cover the shielding pattern 527 which is disposed on the first interlayer-insulating layer 530 and may have a flat top surface without forming a level difference around it. Optionally, the second interlayer-insulating layer 535 may be disposed on the first interlayer-insulating layer 530 to have substantially the same thickness along the profile of the shielding pattern 527.

The clock signal wiring 545 may be disposed on the first via-insulating layer 540. The clock signal may be supplied to the scan shift register 220 of FIG. 2 and the emission shift register 320 of FIG. 4 through the clock signal wiring 545. In an embodiment, the clock signal wiring 545 may be disposed in the same layer as the connection electrode 556 of FIG. 6. The clock signal wiring 545 may be simultaneously formed of the same material as the connection electrode 556 of FIG. 6. In an embodiment, the clock signal wiring 545 may be disposed on the source pattern 524 and the drain pattern 525. The clock signal wiring 545 may be disposed to overlap the gate pattern 526 in a plan view. As the clock signal wiring 545 and the gate pattern 526 are disposed to overlap each other in a plan view, parasitic capacitance may occur between the clock signal wiring 545 and the gate pattern 526. A coupling phenomenon may occur between the clock signal wiring 545 and the gate pattern 526 due to the parasitic capacitance. When the coupling phenomenon occurs, malfunction of the scan driver 200 and the emission driver 300 may be caused. The coupling phenomenon may cause a glitch phenomenon in the scan signal and the emission signal. Due to the occurrence of a glitch phenomenon, a short circuit may occur, which may increase power consumption. According to the invention, the shielding pattern 527 may be disposed to prevent such a coupling phenomenon.

The shielding pattern 527 may be disposed on the first interlayer-insulating layer 530. In an embodiment, the shielding pattern 527 may be disposed in the same layer as the capacitance electrode 536 of FIG. 6. The shielding pattern 527 may be simultaneously formed of the same material as the capacitance electrode 536 of FIG. 6.

The shielding pattern 527 may be disposed between the source pattern 524 and the drain pattern 525 so as not to overlap with any of the source pattern 524 and the drain pattern 525 in a plan view. The shielding pattern 527 may be disposed between the gate pattern 526 and the clock signal wiring 545. The shielding pattern 527 may be disposed to overlap the gate pattern 526 and the clock signal wiring 545 in a plan view. The constant voltage (e.g., a first constant voltage VGH, a second constant voltage VGL) may be applied to the shielding pattern 527. Since the constant voltage has a constant polarity and magnitude, the shielding pattern 527 to which the constant voltage is applied may shield the gate pattern 526 and the clock signal wiring 545 by located between the gate pattern 526 and the clock signal wiring 545. Since the shielding pattern 527 shields the gate pattern 526 and the clock signal wiring 545, a coupling phenomenon that may occur between the gate pattern 526 and the clock signal wiring 545 can be effectively prevented.

The second via-insulating layer 550 may be disposed on the clock signal wiring 545. The second via-insulating layer 550 may include or be made of an organic material or an inorganic material. In an embodiment, the first via-insulating layer 540 may be formed of an organic material such as acrylic, benzocyclobutene (BCB), polyimide, or hexamethyldisiloxane (HMDSO).

Figure 9:
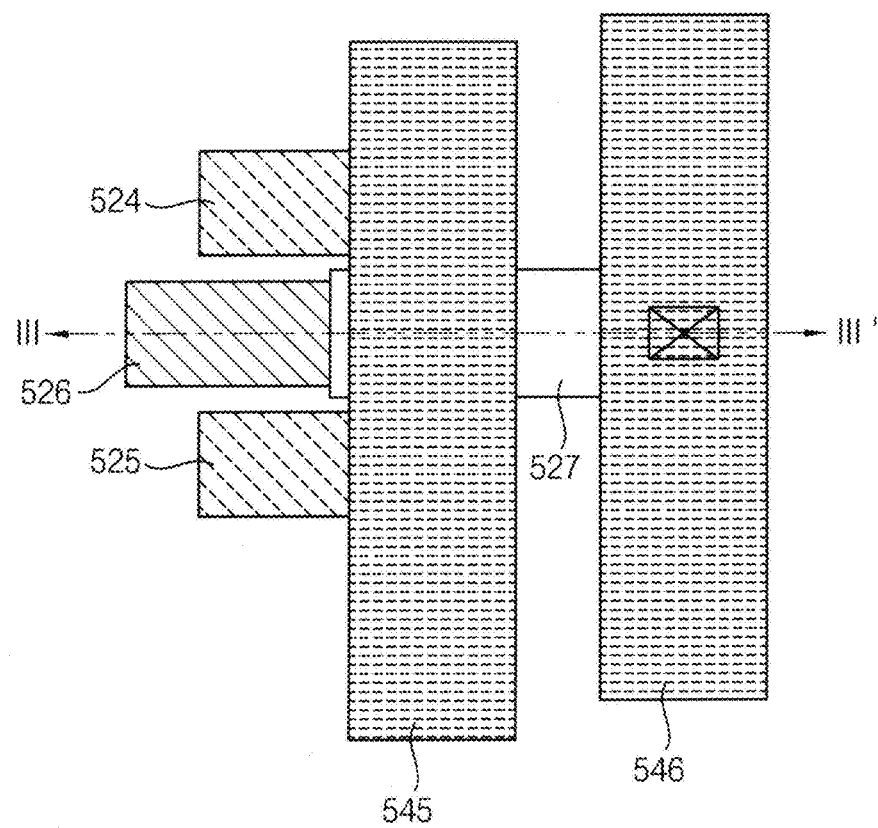
FIG. 9 is a plan view illustrating another embodiment of a driving transistor.
Figure 10:
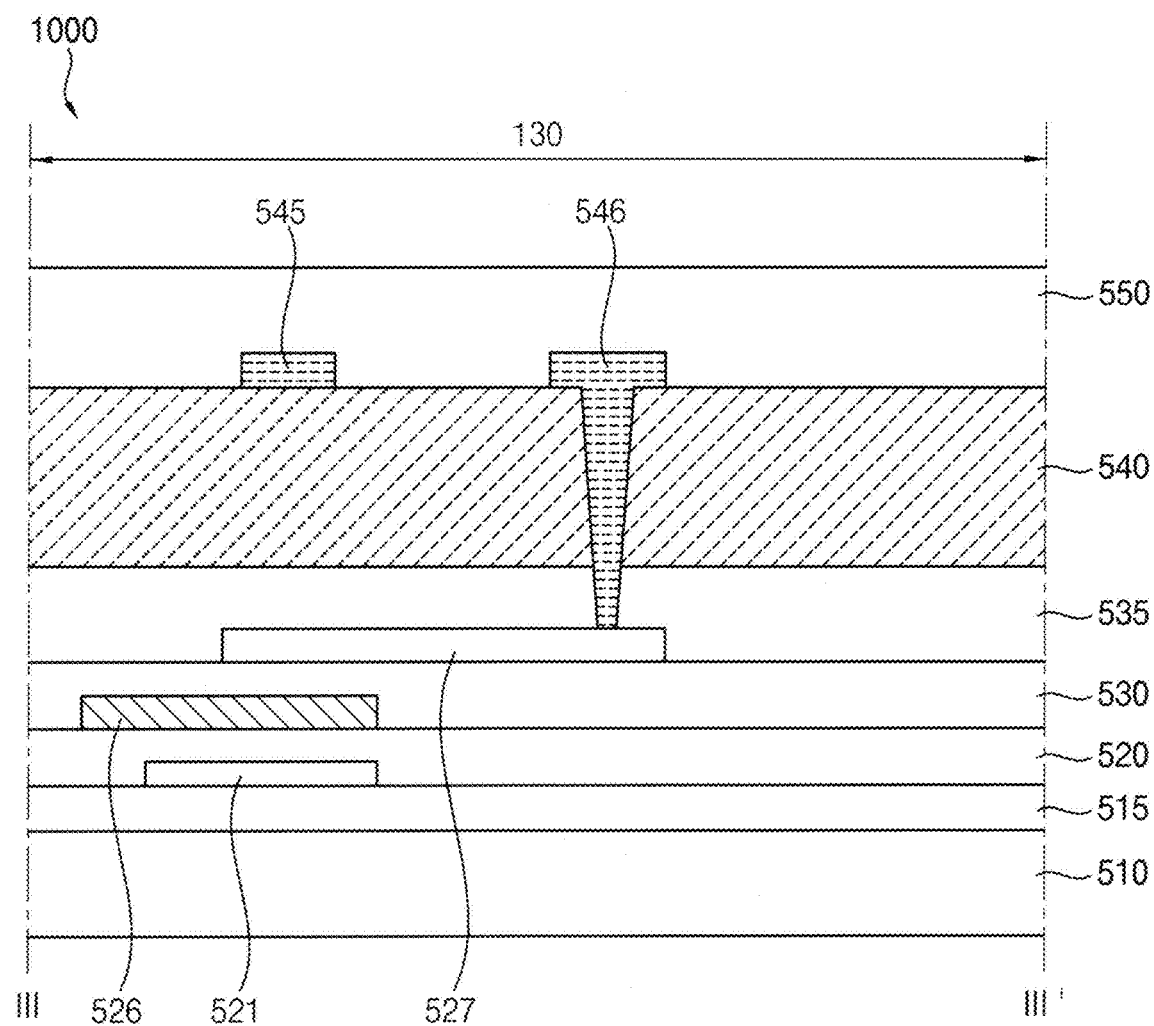
FIG. 10 is a cross-sectional view taken along line III-III' of FIG. 9.

FIG. 9 is a plan view illustrating an embodiment of a driving transistor, and FIG. 10 is a cross-sectional view taken along line III-III' of FIG. 9.

Referring to FIGS. 9 and 10, the driving circuit 130 may include a substrate 510, a buffer layer 515, a gate insulating layer 520, an active pattern 521 and a gate pattern 526 of a driving transistor, a first interlayer-insulating layer 530, a second interlayer-insulating layer 535, a first via-insulating layer 540, a second via-insulating layer 550, a shielding pattern 527, a clock signal wiring 545, and a connection wiring 546. The active pattern 521 may electrically contact the source pattern 524 and the drain pattern 525 when turned on.

In an embodiment, the connection wiring 546 may be disposed in the same layer as the clock signal wiring 545. The connection wiring 546 may be disposed to be spaced apart from the clock signal wiring 545. The connection wiring 546 may be connected to the shielding pattern 527 through a contact hole penetrating the first-via-insulating layer 540 and the second interlayer-insulating layer 535. A constant voltage (e.g., a first constant voltage VGH, a second constant voltage VGL) may be applied to the connection wiring 546. The constant voltage applied to the connection wiring 546 may be transmitted to the shielding pattern 527 through the contact hole. The shielding pattern 527 may effectively prevent a coupling phenomenon between the clock signal wiring 545 and the gate pattern 526 by using the constant voltage. The connection wiring 546 may be disposed in the same layer as the clock signal wiring 545. The connection wiring 546 may be simultaneously formed of the same material as the clock signal wiring 545. In an embodiment, the connection wiring 546 and the clock signal wiring 545 may be disposed on the source pattern 524.

Figure 11:
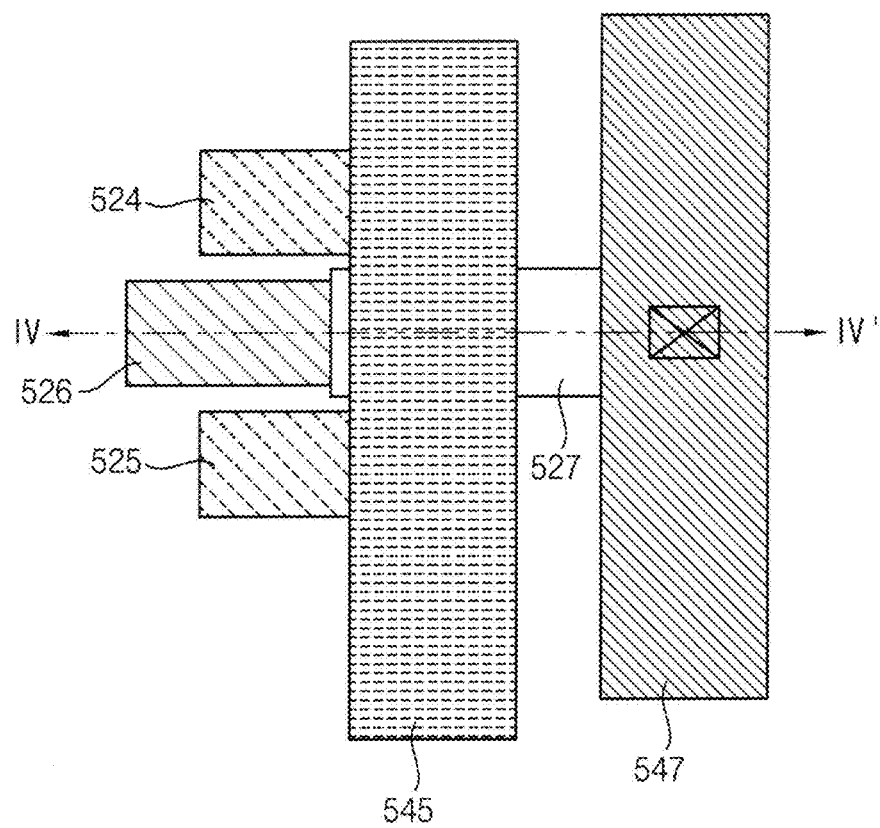
FIG. 11 is a plan view illustrating still another embodiment of a driving transistor.
Figure 12:
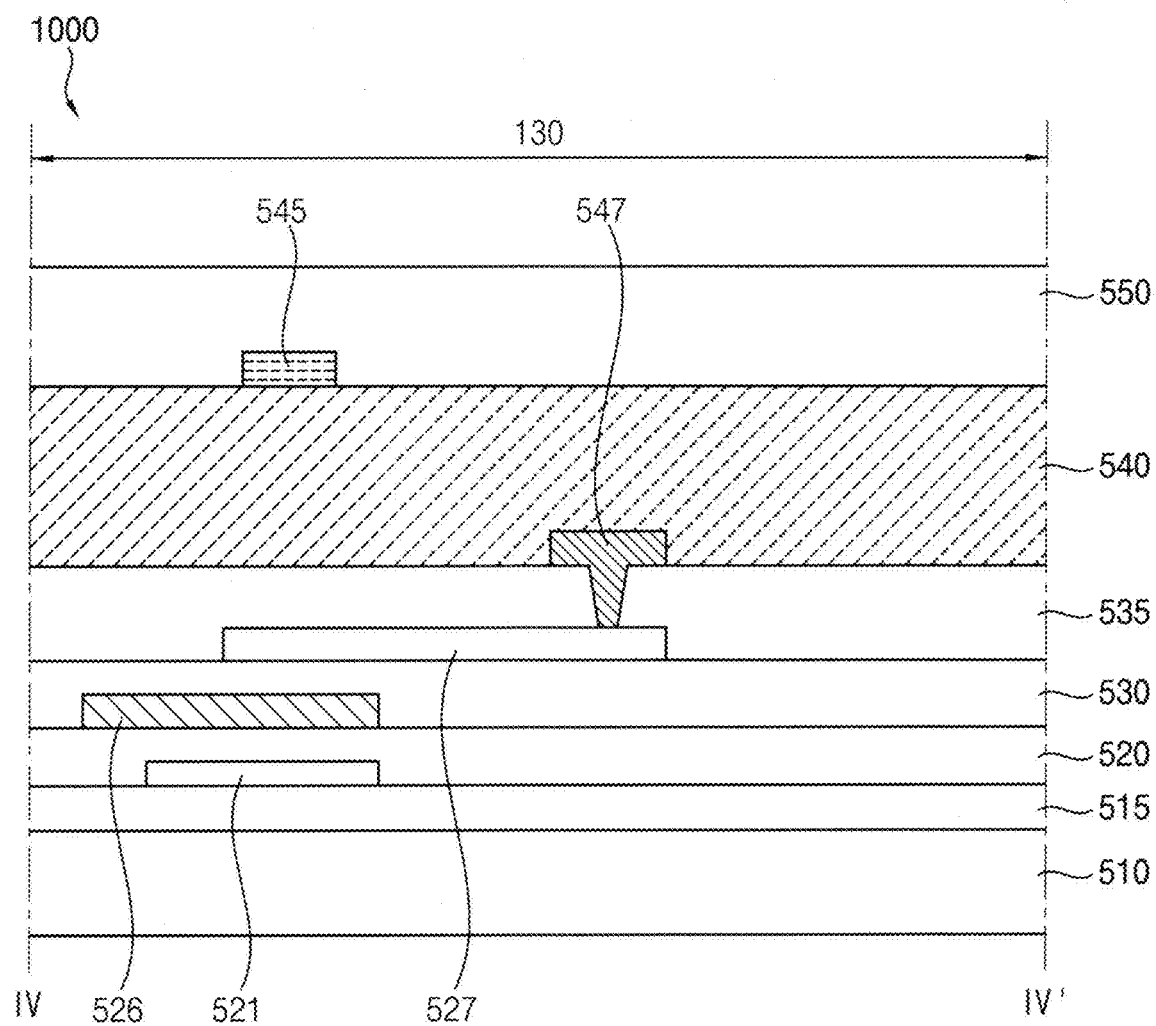
FIG. 12 is a cross-sectional view taken along line IV-IV' of FIG. 11.

FIG. 11 is a plan view illustrating an embodiment of a driving transistor, and FIG. 12 is a cross-sectional view taken along line IV-IV' of FIG. 11.

Referring to FIGS. 10 and 11, the driving circuit 130 may include a substrate 510, a buffer layer 515, a gate insulating layer 520, an active pattern 521 and a gate pattern 526 of a driver transistor, a first interlayer-insulating layer 530, a second interlayer-insulating layer 535, a first via-insulating layer 540, a second via-insulating layer 550, a shielding pattern 527, a clock signal wiring 545, and a connection wiring 547. The active pattern 521 may electrically contact the source pattern 524 and the drain pattern 525 when turned on.

The gate pattern 526 may partially overlap the active pattern 521 in a plan view, and be disposed on the gate insulating layer 520. The shielding pattern 527 may partially overlap the gate pattern 526 in a plan view and be disposed on the first interlayer-insulating layer 530. The shielding pattern 527 may be disposed between the clock signal wiring 545 and the gate pattern 526 to prevent a coupling phenomenon between the clock signal wiring 545 and the gate pattern 526. The clock signal wiring 545 may be disposed to overlap the shielding pattern 527 within a range where the gate pattern 526 and the shielding pattern 527 overlap in a plan view.

The connection wiring 547 may be disposed on the second interlayer-insulating layer 535. The connection wiring 547 may be connected to the shielding pattern 527 through a contact hole penetrating the second interlayer-insulating layer 535. A constant voltage (e.g., a first constant voltage VGH, a second constant voltage VGL) may be applied to the connection wiring 547. The constant voltage applied to the connection wiring 547 may be transmitted to the shielding pattern 527 through the contact hole. The shielding pattern 527 may effectively prevent a coupling phenomenon between the clock signal wiring 545 and the gate pattern 526 by using the constant voltage.

In an embodiment, the connection wiring 547 may be disposed in the same layer as the source and drain patterns 524 and 525. The connection wiring 547 may include or be formed of the same material as the source and drain patterns 524 and 525. In an embodiment, the clock signal wiring 545 may be disposed on the source pattern 524, the drain pattern 525, and the connection wiring 547.

Figure 13:
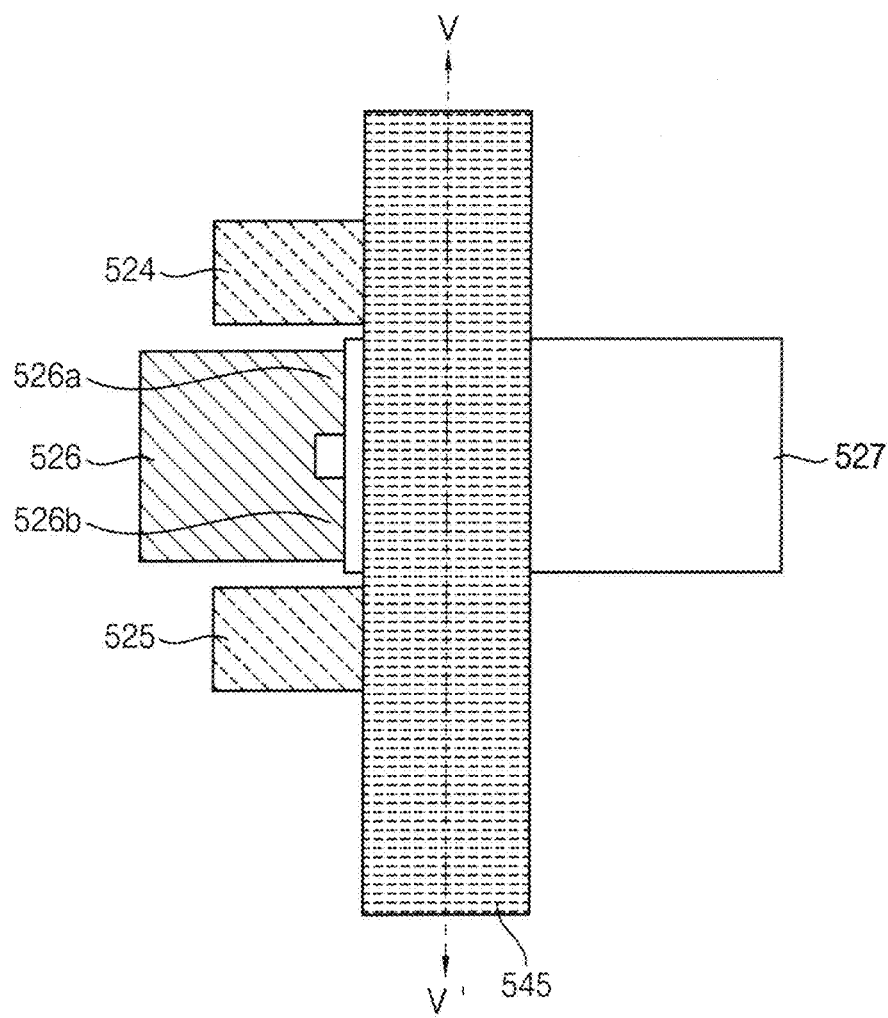
FIG. 13 is a plan view illustrating yet another embodiment of a driving circuit dual gate transistor.
Figure 14:
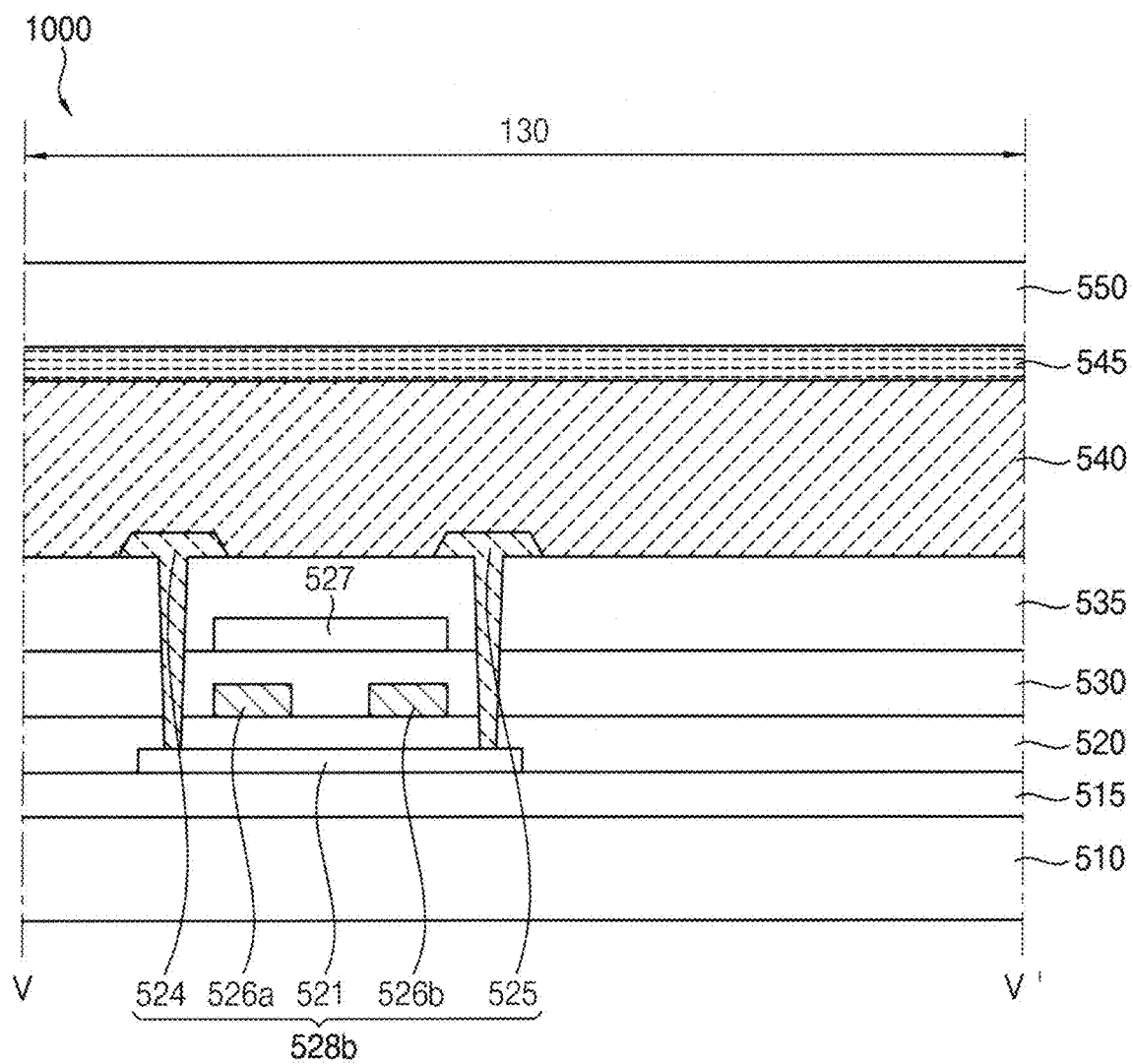
FIG. 14 is a cross-sectional view taken along line V-V' of FIG. 13.

FIG. 13 is a plan view illustrating an embodiment of a driving circuit dual gate transistor, and FIG. 14 is a cross-sectional view taken along line V-V' of FIG. 13.

Referring to FIGS. 13 and 14, the driving circuit 130 may include a substrate 510, a buffer layer 515, a gate insulating layer 520, a driving transistor 528b, a first interlayer-insulating layer 530, a second interlayer-insulating layer 535, a first via-insulating layer 540, a second via-insulating layer 550, a shielding pattern 527, and a clock signal wiring 545. The driving transistor 528b may include an active pattern 521, a source pattern 524, a drain pattern 525, and a gate pattern 526.

The gate pattern 526 may be disposed on the gate insulating layer 520. The gate pattern 526 may be a dual-gate including a first sub-gate pattern 526a and a second sub-gate pattern 526b. In a plan view, the first sub-gate pattern 526a and the second sub-gate pattern 526b may be disposed between the source pattern 524 and the drain pattern 525. In an embodiment, the shielding pattern 527 may shield both the first sub-gate pattern 526a and the second sub-gate pattern 526b to prevent a coupling phenomenon. Further, the shielding pattern 527 may be disposed under the major surface plane (which is disposed on the second interlayer-insulating layer 535) of the source pattern 524 and the drain pattern 525. The clock signal wiring 545 may be disposed on the source pattern 524 and the drain pattern 525.

The shielding pattern 527 may be disposed to overlap the first sub-gate pattern 526a and the second sub-gate pattern 526b in a plan view. The shielding pattern 527 may prevent a coupling phenomenon between the first and second sub-gate patterns 526a and 526b, and the clock signal wiring 545.

Figure 15:
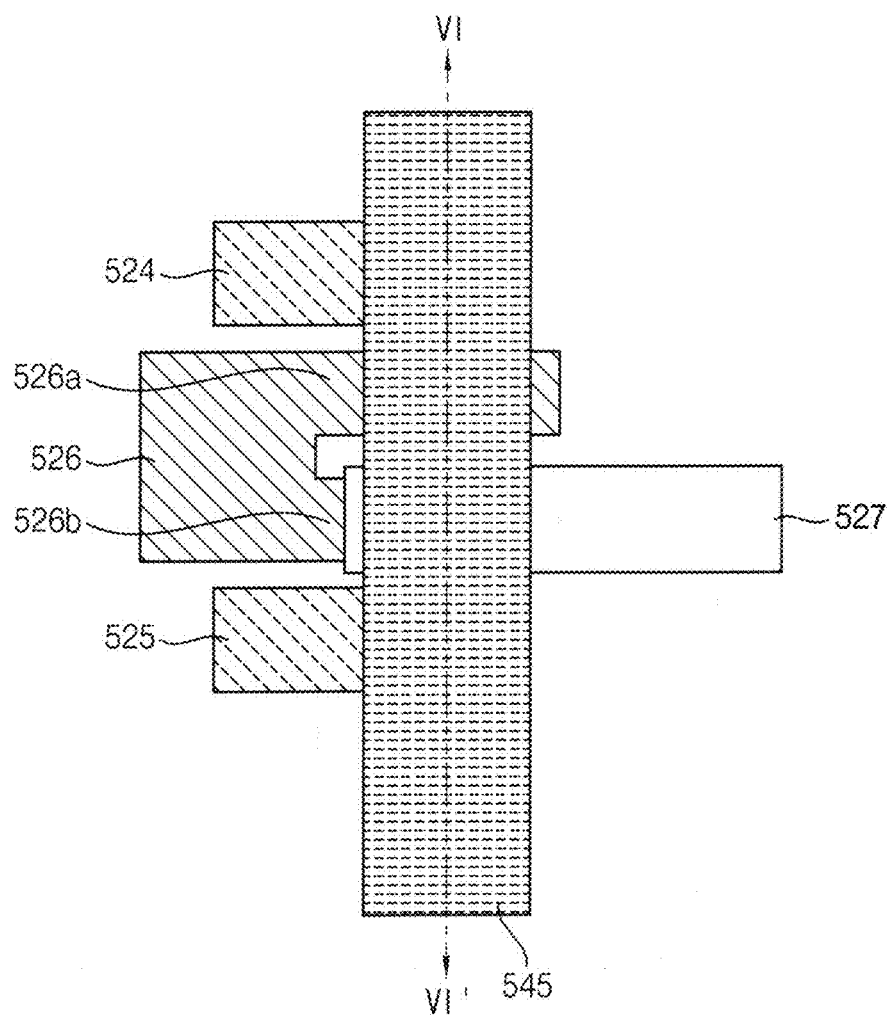
FIG. 15 is a plan view illustrating another embodiment of a driving circuit dual gate transistor.
Figure 16:
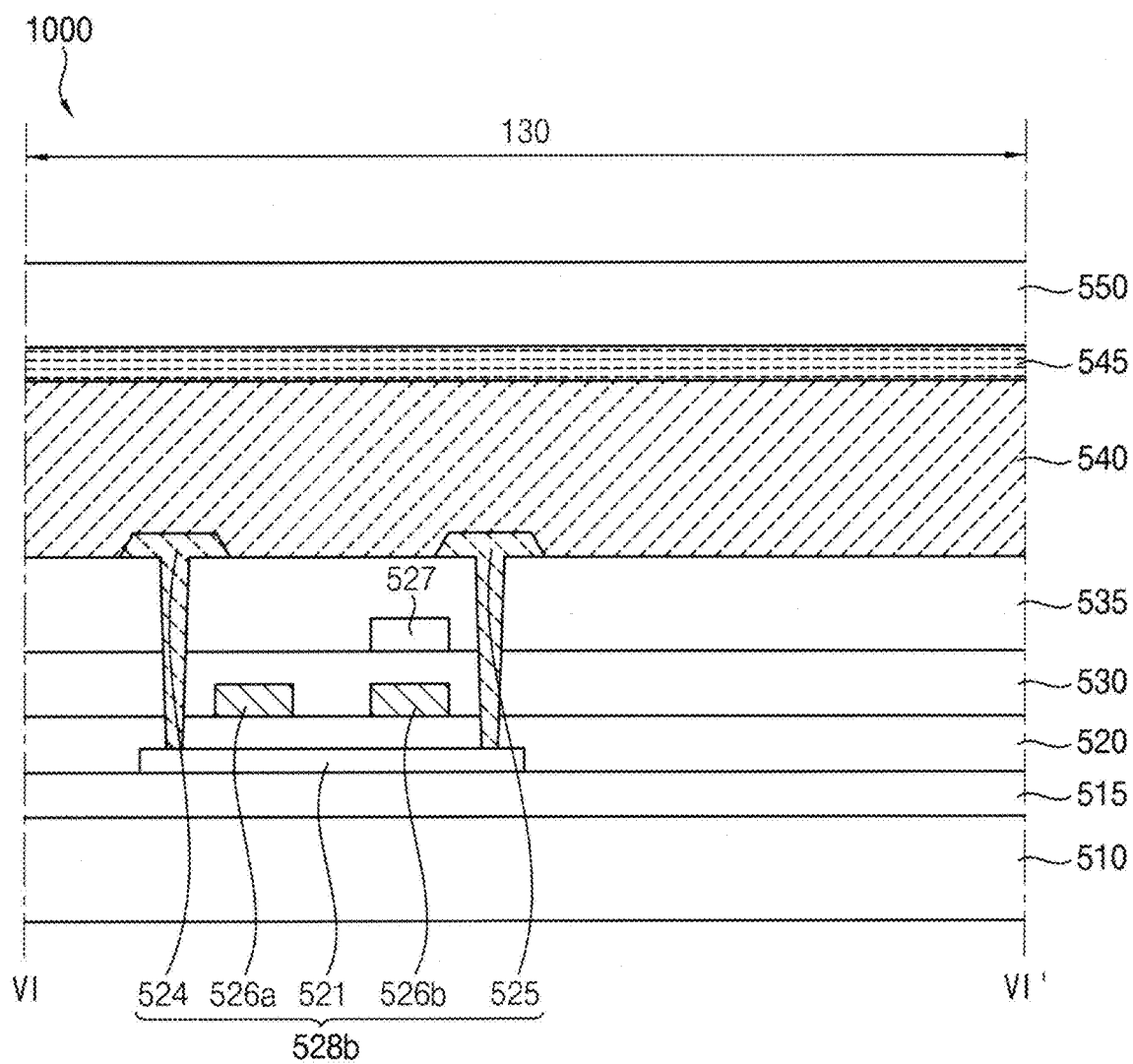
FIG. 16 is a cross-sectional view taken along line VI-VI' of FIG. 15.

FIG. 15 is a plan view illustrating an embodiment of a driving circuit dual gate transistor, and FIG. 16 is a cross-sectional view taken along line VI-VI' of FIG. 15.

As illustrated in FIGS. 15 and 16, the shielding pattern 527 may overlap one of the first sub-gate pattern 526a and the second sub-gate pattern 526b in a plan view.

Figure 17:
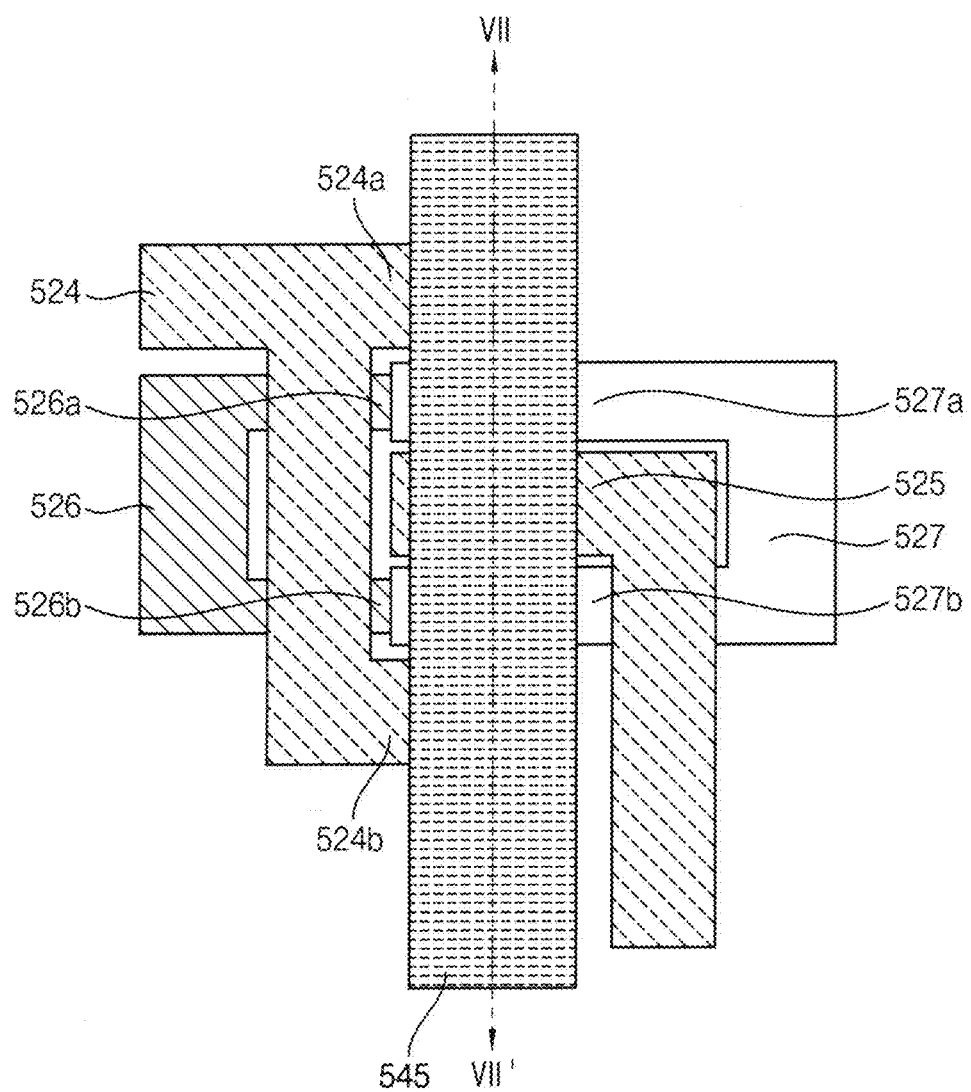
FIG. 17 is a plan view illustrating still another embodiment of a driving circuit dual gate transistor.
Figure 18:
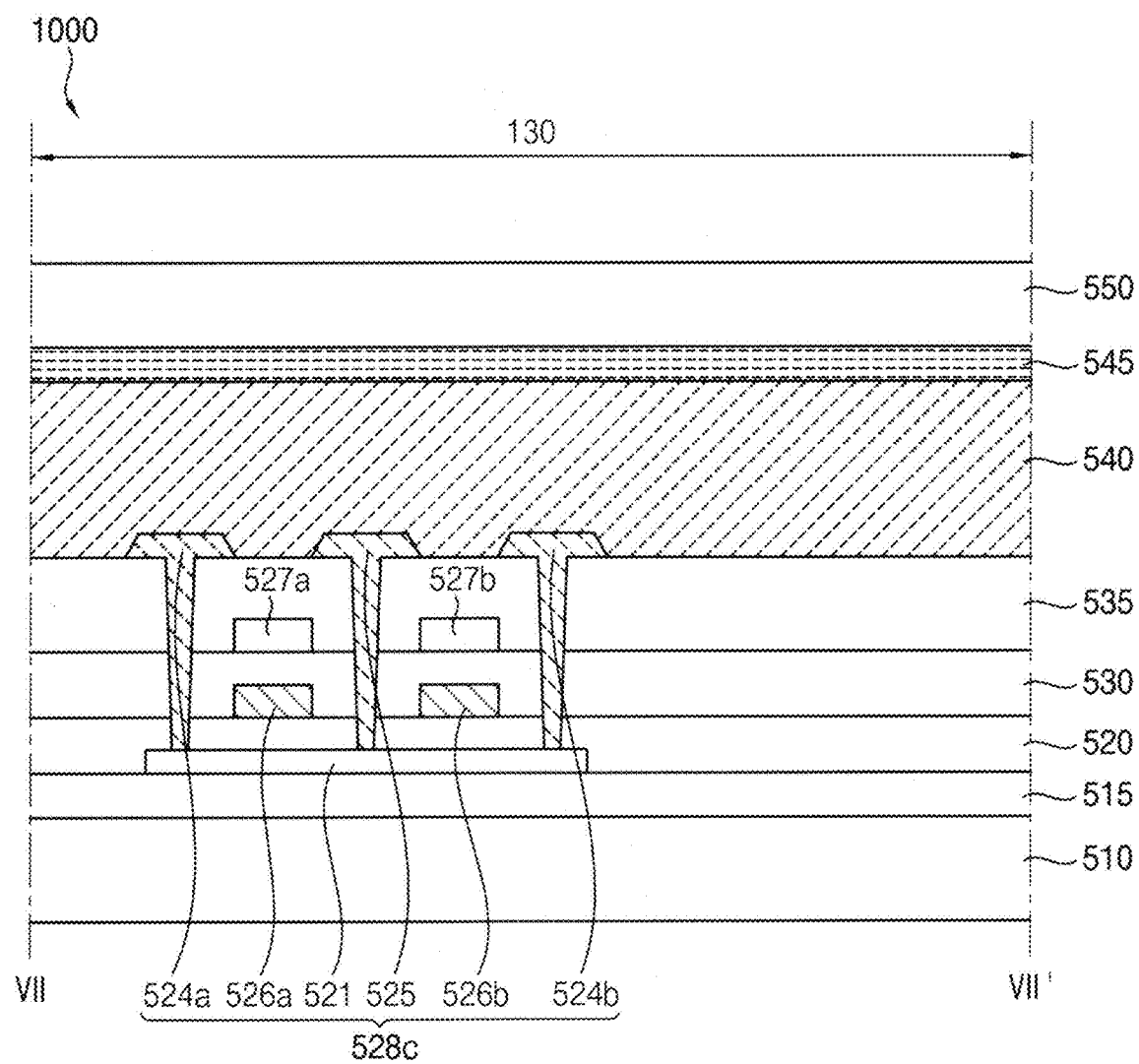
FIG. 18 is a cross-sectional view taken along line VII-VII' of FIG. 17.

FIG. 17 is a plan view illustrating an embodiment of a driving circuit dual gate transistor, FIG. 18 is a cross-sectional view taken along line VII-VII' of FIG. 17.

Referring to FIGS. 17 and 18, the driving circuit 130 may include a substrate 510, a buffer layer 515, a gate insulating layer 520, a driving transistor 528c, a first interlayer-insulating layer 530, a second interlayer-insulating layer 535, a first via-insulating layer 540, a second via-insulating layer 550, a shielding pattern 527, and a clock signal wiring 545. The driving transistor 528c may include an active pattern 521, a source pattern 524, a drain pattern 525, and a gate pattern 526. The source pattern 524 may include a first sub-source pattern 524a and a second sub-source pattern 524b.

The gate pattern 526 may be disposed on the gate insulating layer 520. The gate pattern 526 may be a dual-gate including a first sub-gate pattern 526a and a second sub-gate pattern 526b. The first sub-gate pattern 526a and the second sub-gate pattern 526b may be disposed between the first sub-source pattern 524a and the second sub-source pattern 524b.

The shielding pattern 527 may be disposed on the first interlayer-insulating layer 530. The shielding pattern 527 may include a first sub shielding pattern 527a and a second sub shielding pattern 527b. The shielding pattern 527 may be disposed to overlap the gate pattern 526 in a plan view. In an embodiment, the first sub-shielding pattern 527a may be disposed to overlap the first sub-gate pattern 526a in a plan view, and the second sub-shielding pattern 527b may be disposed to overlap the second sub-gate pattern 526b in a plan view. Through this, a coupling phenomenon between the clock signal wiring 545 and each of the first sub-gate pattern 526a and the second sub-gate pattern 526b may be effectively prevented.

The first sub-source pattern 524a, the second sub-source pattern 524b, and the drain pattern 525 may be disposed on the second interlayer-insulating layer 535. The first and second sub-source patterns 524a and 524b may be connected to first and second source regions of 521 of the active pattern 521 through contact holes penetrating the gate insulating layer 520, the first interlayer-insulating layer 530, and the second interlayer-insulating layer 535. The drain pattern 525 may be connected to a drain region of the active pattern 521 through a contact hole penetrating the gate insulating layer 520, the first interlayer-insulating layer 530, and the second interlayer-insulating layer 535. In an embodiment, a clock signal wiring 545 may be disposed on the first and second sub-source patterns 524a and 524b, and the drain pattern 525.

Figure 19:
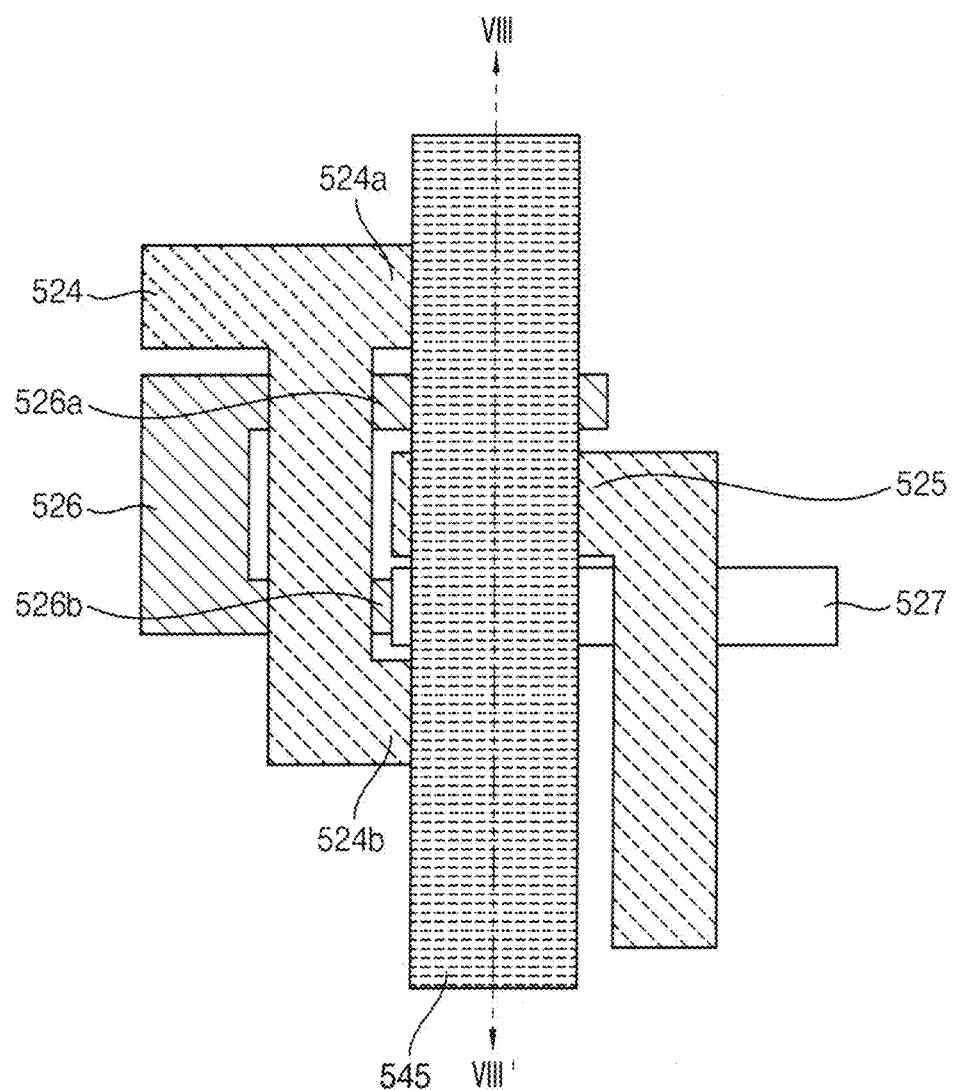
FIG. 19 is a plan view illustrating yet another embodiment of a driving circuit dual gate transistor.
Figure 20:
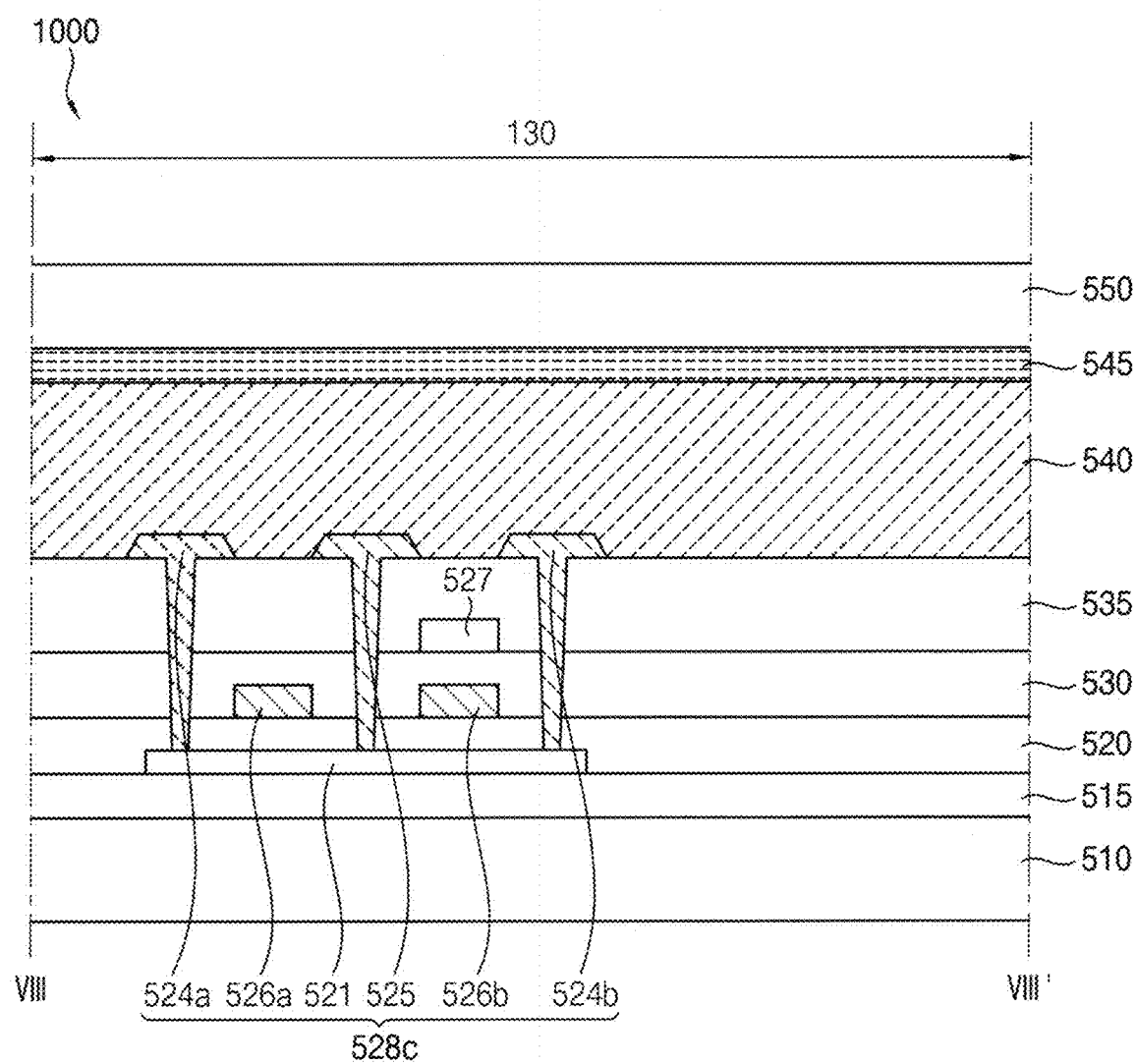
FIG. 20 is a cross-sectional view taken along line VIII-VIII' of FIG. 19.

FIG. 19 is a plan view illustrating an embodiment of a driving circuit dual gate transistor, FIG. 20 is a cross-sectional view taken along line VIII-VIII' of FIG. 19.

As illustrated in FIGS. 19 and 20, the shielding pattern 527 may overlap one of the first sub-gate pattern 526a and the second sub-gate pattern 526b in a plan view.

Figure 21:
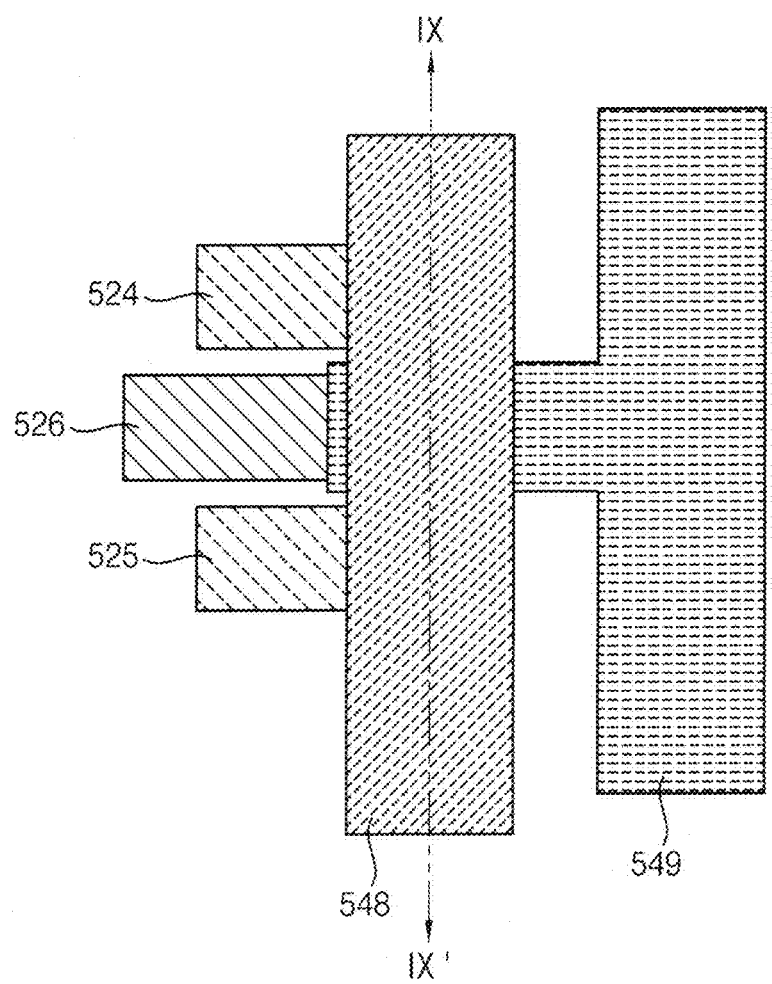
FIG. 21 is a plan view illustrating another embodiment of a driving transistor.
Figure 22:
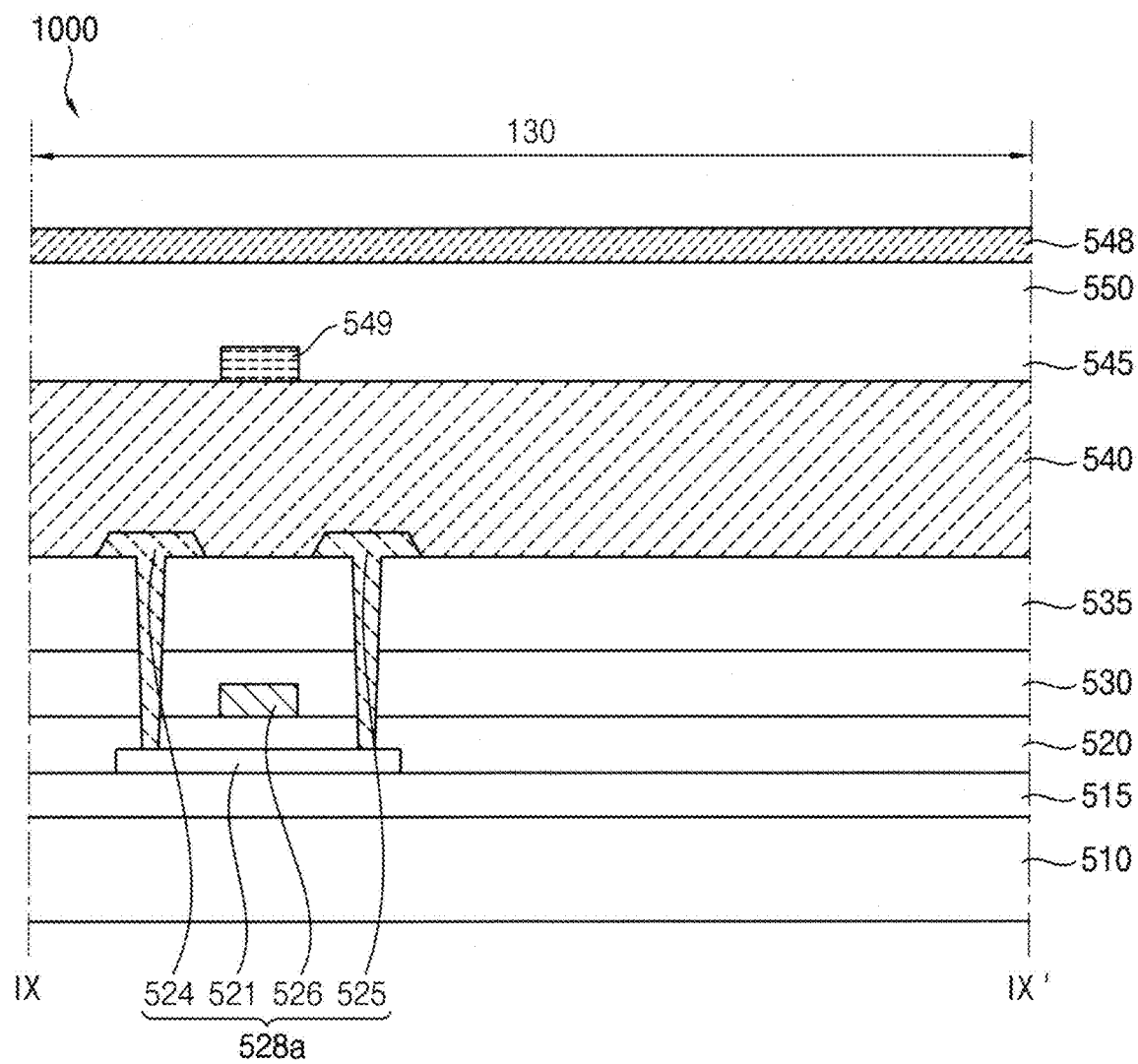
FIG. 22 is a cross-sectional view taken along line IX-IX' of FIG. 21.

FIG. 21 is a plan view illustrating an embodiment of a driving transistor, and FIG. 22 is a cross-sectional view taken along line IX-IX' of FIG. 21.

Referring to FIGS. 21 and 22, the driving circuit 130 may include a substrate 510, a buffer layer 515, a gate insulating layer 520, a driving transistor 528a, a first interlayer-insulating layer 530, a second interlayer-insulating layer 535, a first via-insulating layer 540, a second via-insulating layer 550, a clock signal wiring 548, and a shielding pattern 549. The driving transistor 528a may include an active pattern 521, a source pattern 524, a drain pattern 525, and a gate pattern 526.

The shielding pattern 549 may be disposed on the first via-insulating layer 540. The shielding pattern 549 may be disposed to overlap the gate pattern 526 in a plan view. The shielding pattern 549 may not overlap the source pattern 524 and the drain pattern 525 in a plan view. A constant voltage (e.g., a first constant voltage VGH, a second constant voltage VGL) may be applied to the shielding pattern 549. As the constant voltage is applied to the shielding pattern 549, the shielding pattern 549 may shield the gate pattern 526. In an embodiment, the shielding pattern 549 may be disposed in the same layer as the connection wiring 546 of FIG. 10. That is, the shielding pattern 549 may be disposed on the source pattern 524 and the drain pattern 525.

The clock signal wiring 548 may be disposed on the second via-insulating layer 550. The clock signal wiring 548 may be disposed on the shielding pattern 549. Clock signals may flow through the clock signal wiring 548. As the shielding pattern 549 is disposed to overlap the gate pattern 526 in a plan view, a coupling phenomenon between the gate pattern 526 and the clock signal wiring 548 can be effectively prevented. The shielding pattern 549 may include a metal, an alloy, a metal nitride, a conductive metal oxide, a transparent conductive material, or the like. These may be used alone or in combination with each other.

The present inventive concept may be applied to a display apparatus and an electronic apparatus including the display apparatus. For example, the present inventive concept may be applied to a smart phone, a cellular phone, a video phone, a smart pad, a smart watch, a tablet PC, a car navigation system, a television, a computer monitor, a laptop, a head mounted display apparatus, MP3 player, etc.

The foregoing is illustrative of embodiments and is not to be construed as limiting thereof. Although embodiments have been described, those skilled in the art will readily appreciate that many modifications are possible in embodiments without materially departing from the novel teachings and advantages of the present inventive concept. Accordingly, all such modifications are intended to be included within the scope of the present inventive concept as defined in the claims. Therefore, it is to be understood that the foregoing is illustrative of embodiments and is not to be construed as limited to the example embodiments disclosed, and that modifications to the disclosed example embodiments, as well as other example embodiments, are intended to be included within the scope of the appended claims.

What is claimed is:
1. A display apparatus comprising:
a display panel;

a driving circuit which provides a driving signal to the display panel and includes at least one driving transistor; and a clock signal wiring which provides a clock signal to the driving circuit, wherein the driving circuit includes an active pattern, a gate pattern, a source pattern and a shielding pattern, the gate pattern overlaps the active pattern in a plan view, a major surface plane of the source pattern is disposed in a layer different from a layer the active pattern is disposed in, the source pattern is electrically connected to the active pattern, and the shielding pattern is disposed between the gate pattern and the clock signal wiring and applied with a constant voltage, and wherein the clock signal wiring overlaps the gate pattern in the plan view and is disposed on the source pattern.

2. The display apparatus of claim 1, wherein the shielding pattern is disposed under the major surface plane of the source pattern.

3. The display apparatus of claim 1, wherein the shielding pattern overlaps an entire region in which the gate pattern overlaps the clock signal wiring in the plan view.

4. The display apparatus of claim 1, further comprising:
a connection wiring disposed in a same layer as the clock signal wiring and which transmits the constant voltage to the shielding pattern.

5. The display apparatus of claim 1, further comprising:
a connection wiring disposed between the shielding pattern and the clock signal wiring, and which transmits the constant voltage to the shielding pattern.

6. The display apparatus of claim 5, wherein the connection wiring does not overlap each of the clock signal wiring and the gate pattern in the plan view.

7. The display apparatus of claim 1, wherein the gate pattern includes a first sub gate pattern and a second sub gate pattern.

8. The display apparatus of claim 7, wherein the first sub gate pattern and the second sub gate pattern are disposed under the major surface plane of the source pattern.

9. The display apparatus of claim 8, wherein the first sub gate pattern and the second sub gate pattern overlap the shielding pattern in the plan view.

10. The display apparatus of claim 8, wherein only one of the first sub gate pattern and the second sub gate pattern overlaps the shielding pattern in the plan view.

11. The display apparatus of claim 7, wherein the first sub gate pattern and the second sub gate pattern are disposed in a same layer.

12. The display apparatus of claim 11, wherein the driving circuit further includes a drain pattern disposed between the first sub gate pattern and the second sub gate pattern and electrically connected to the active pattern.

13. The display apparatus of claim 12, wherein only one of the first sub gate pattern and the second sub gate pattern overlaps the shielding pattern in the plan view.

14. The display apparatus of claim 12, wherein the shielding pattern includes a first sub shielding pattern and a second sub shielding pattern.

15. The display apparatus of claim 14, wherein the first sub gate pattern and the second sub gate pattern overlap the first sub shielding pattern and the second sub shielding pattern, respectively, in the plan view.

16. The display apparatus of claim 1, wherein the shielding pattern is disposed on the source pattern.

17. The display apparatus of claim 1, wherein the driving circuit includes a p-type transistor.

18. The display apparatus of claim 1, wherein the driving circuit includes an n-type transistor.

19. The display apparatus of claim 1, wherein the driving circuit includes a dual gate transistor.

* * * * *